US012645248B2

(12) United States Patent
Kang

(10) Patent No.: US 12,645,248 B2
(45) Date of Patent: Jun. 2, 2026

(54) BUFFER CIRCUIT, AND SEMICONDUCTOR APPARATUS CAPABLE OF ADJUSTING A CLOCK RECEIVER AND/OR CHANGING A CLOCK PATH ACCORDING TO FREQUENCY INFORMATION

(71) Applicant: SK hynix Inc., Icheon-si (KR)

(72) Inventor: Ji Hyo Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 92 days.

(21) Appl. No.: 18/545,857

(22) Filed: Dec. 19, 2023

(65) Prior Publication Data

US 2025/0053189 A1     Feb. 13, 2025

(30) Foreign Application Priority Data

Aug. 7, 2023     (KR) ........................ 10-2023-0102887

(51) Int. Cl.
| | |
|---|---|
| G06F 1/08 | (2006.01) |
| G06F 1/10 | (2006.01) |
| G06F 1/12 | (2006.01) |
| G06F 1/324 | (2019.01) |
| H03L 7/089 | (2006.01) |
| H03L 7/191 | (2006.01) |

(52) U.S. Cl.
CPC .................. *G06F 1/08* (2013.01); *G06F 1/10* (2013.01); *G06F 1/12* (2013.01); *H03L 7/0893* (2013.01); *H03L 7/0896* (2013.01); *H03L 7/191* (2013.01); *G06F 1/324* (2013.01)

(58) Field of Classification Search
CPC ..... G06F 1/08; G06F 1/10; G06F 1/12; G06F 1/324; H03L 7/0893; H03L 7/0896; H03L 7/191
See application file for complete search history.

(56) References Cited

U.S. PATENT DOCUMENTS

| | | |
|---|---|---|
| 9,898,218 B2 | 2/2018 | Healy et al. |
| 11,233,500 B1 * | 1/2022 | Kang ..................... H03K 3/037 |
| 11,385,674 B2 | 7/2022 | Jang et al. |
| 2013/0207722 A1 | 8/2013 | Bulzacchelli et al. |
| 2021/0305989 A1 * | 9/2021 | Han .......................... H03L 7/07 |
| 2023/0021200 A1 | 1/2023 | Rattan |
| 2023/0064147 A1 * | 3/2023 | Cho .......................... G05F 1/56 |

FOREIGN PATENT DOCUMENTS

| | | |
|---|---|---|
| KR | 1020110026049 A | 3/2011 |
| KR | 1020200100345 A | 8/2020 |
| KR | 1020230032191 A | 3/2023 |

OTHER PUBLICATIONS

Shekhar, Sudip, et al. Bandwidth Extension Techniques for CMOS Amplifiers, IEEE Journal of Solid-State Circuits, vol. 41, No. 11 Nov. 2006, USA.

* cited by examiner

*Primary Examiner* — Lincoln D Donovan
*Assistant Examiner* — James G Yeaman
(74) *Attorney, Agent, or Firm* — WILLIAM PARK AND ASSOCIATES LTD.

(57) ABSTRACT

A semiconductor apparatus includes a frequency control circuit and an internal clock generation circuit. The frequency control circuit generates a frequency information signal based on a command address signal, and generates a frequency control signal by comparing the frequency information signal with a frequency setting signal. The internal clock generation circuit generates an internal clock signal from a system clock signal based on the frequency control signal.

17 Claims, 8 Drawing Sheets

BUFFER CIRCUIT, AND SEMICONDUCTOR APPARATUS CAPABLE OF ADJUSTING A CLOCK RECEIVER AND/OR CHANGING A CLOCK PATH ACCORDING TO FREQUENCY INFORMATION

CROSS-REFERENCES TO RELATED APPLICATION

The present application claims priority under 35 U.S.C. § 119(a) to Korean application number 10-2023-0102887, filed on Aug. 7, 2023, in the Korean Intellectual Property Office, which is incorporated herein by reference in its entirety.

BACKGROUND

1. Technical Field

The present disclosure relates to an integrated circuit technology, and more particularly, to a buffer circuit and a semiconductor apparatus capable of adjusting a clock receiver and/or changing a clock path according to frequency information.

2. Related Art

Electronic devices may include many electronic components, and among the electronic devices, a computer system may include many semiconductor apparatuses made of semiconductors. The semiconductor apparatuses constituting the computer system may perform data communication in synchronization with a clock signal. One semiconductor apparatus may transmit data in synchronization with the clock signal, and another semiconductor apparatus connected to the one semiconductor apparatus may receive the data in synchronization with the clock signal.

In order to improve a data communication rate, the frequency of the clock signal used in the computer system continuously increases. In general, a current mode logic (CML) buffer is used for propagation of a clock signal having a high frequency, and a complementary metal-oxide-semiconductor (CMOS) buffer is used for propagation of a clock signal having a low frequency. The CML buffer has large power consumption, and the CMOS buffer is not able to transmit the clock signal having a high frequency without loss. Accordingly, the trade-off relationship between stable propagation of the clock signal and power consumption reduction needs to be optimized according to the frequency of the clock signal used in the computer system.

SUMMARY

A semiconductor apparatus in accordance with an embodiment may include a frequency detector, a first frequency control signal generator, a second frequency control signal generator, and an internal clock generation circuit. The frequency detector may be configured to generate a frequency information signal based on a command address signal. The first frequency control signal generator may be configured to compare a first frequency setting signal with the frequency information signal to generate a first frequency control signal. The second frequency control signal generator may be configured to compare a second frequency setting signal with the frequency information signal to generate a second frequency control signal. The internal clock generation circuit may be configured to generate an internal clock signal from a system clock signal based on the first and second frequency control signals.

A semiconductor apparatus in accordance with an embodiment may include a frequency control circuit and a clock receiver. The frequency control circuit may be configured to generate a frequency information signal based on a command address signal and configured to compare a first frequency setting signal with the frequency information signal to generate a first frequency control signal. The clock receiver may be configured to receive a system clock signal to generate a received clock signal, to increase an AC gain of the clock receiver when the first frequency control signal is enabled, and to increase a DC gain of the clock receiver when the first frequency control signal is disabled.

A semiconductor apparatus in accordance with an embodiment may include a frequency control circuit, a clock receiver, a first clock path, and a second clock path. The frequency control circuit may be configured to generate a frequency information signal based on a command address signal and configured to compare a first frequency setting signal with the frequency information signal to generate a first frequency control signal. The clock receiver may be configured to receive a system clock signal to generate a received clock signal. The first clock path may be configured to buffer the received clock signal at a current mode logic (CML) level to generate a first differential clock signal pair when the first frequency control signal is enabled; and a second clock path configured to buffer the received clock signal at a complementary metal-oxide-semiconductor (CMOS) level to generate a second differential clock signal pair when the first frequency control signal is disabled.

A semiconductor apparatus in accordance with an embodiment may include a clock receiver configured to receive a system clock signal to generate a received clock signal, to increase a gain of the clock receiver when a frequency of the system clock signal is a first frequency, and to increase a gain of the clock receiver when a frequency of the system clock signal is a second frequency. The first frequency may be greater than the second frequency.

BRIEF DESCRIPTION OF THE DRAWINGS

FIG. 1 is a block diagram illustrating a configuration of a semiconductor system in accordance with an embodiment.

FIG. 9 is a diagram illustrating a configuration of a data clock generator illustrated in FIG. 2.

DETAILED DESCRIPTION

Figure 2:
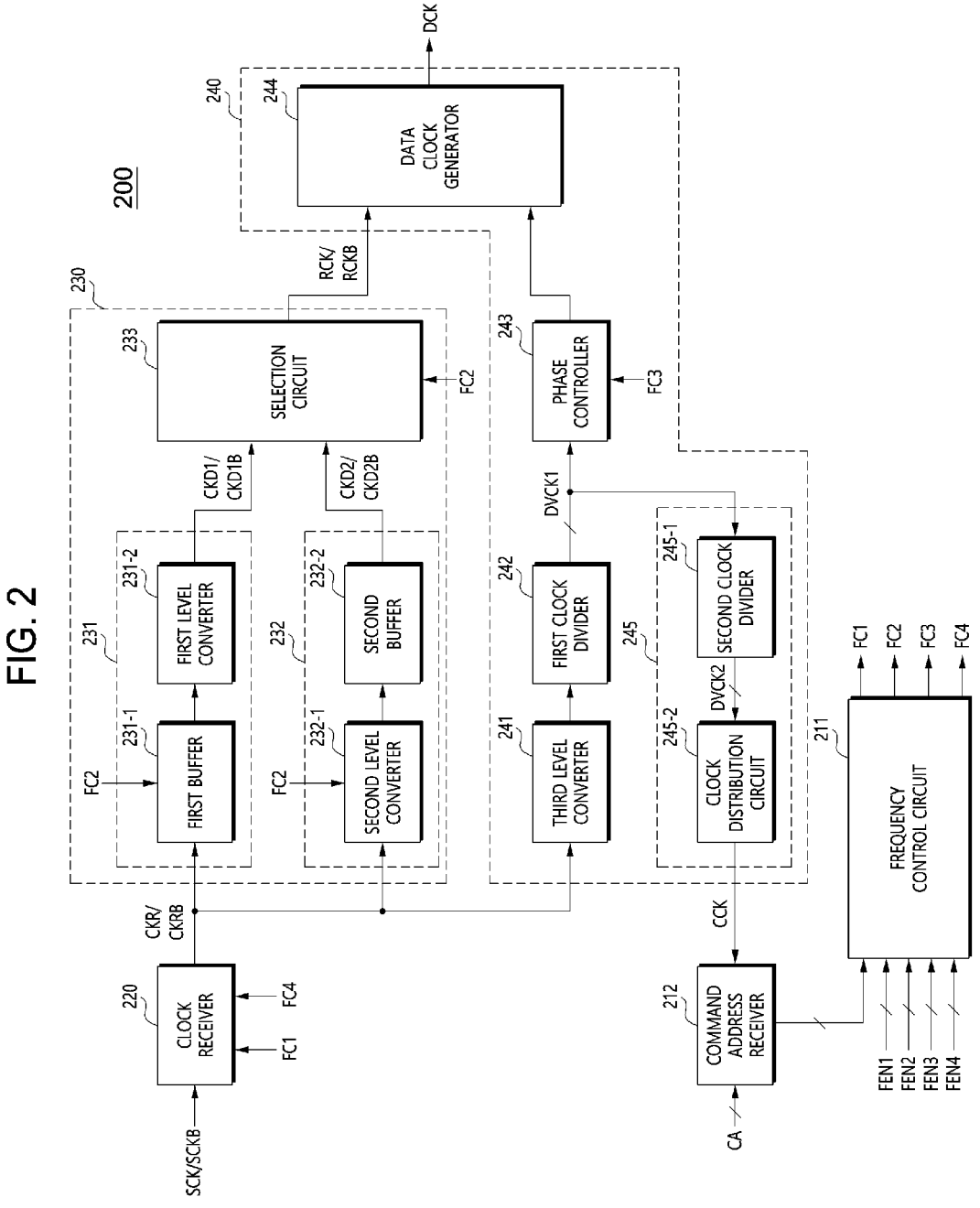
FIG. 2 is a block diagram illustrating a configuration of a semiconductor apparatus in accordance with an embodiment.

It will be understood that although the terms first, second, third etc. may be used herein to describe various elements, these elements should not be limited by these terms. These terms are only used to distinguish one element from another element, but not used to define only the element itself or to mean a particular sequence.

Figure 1:
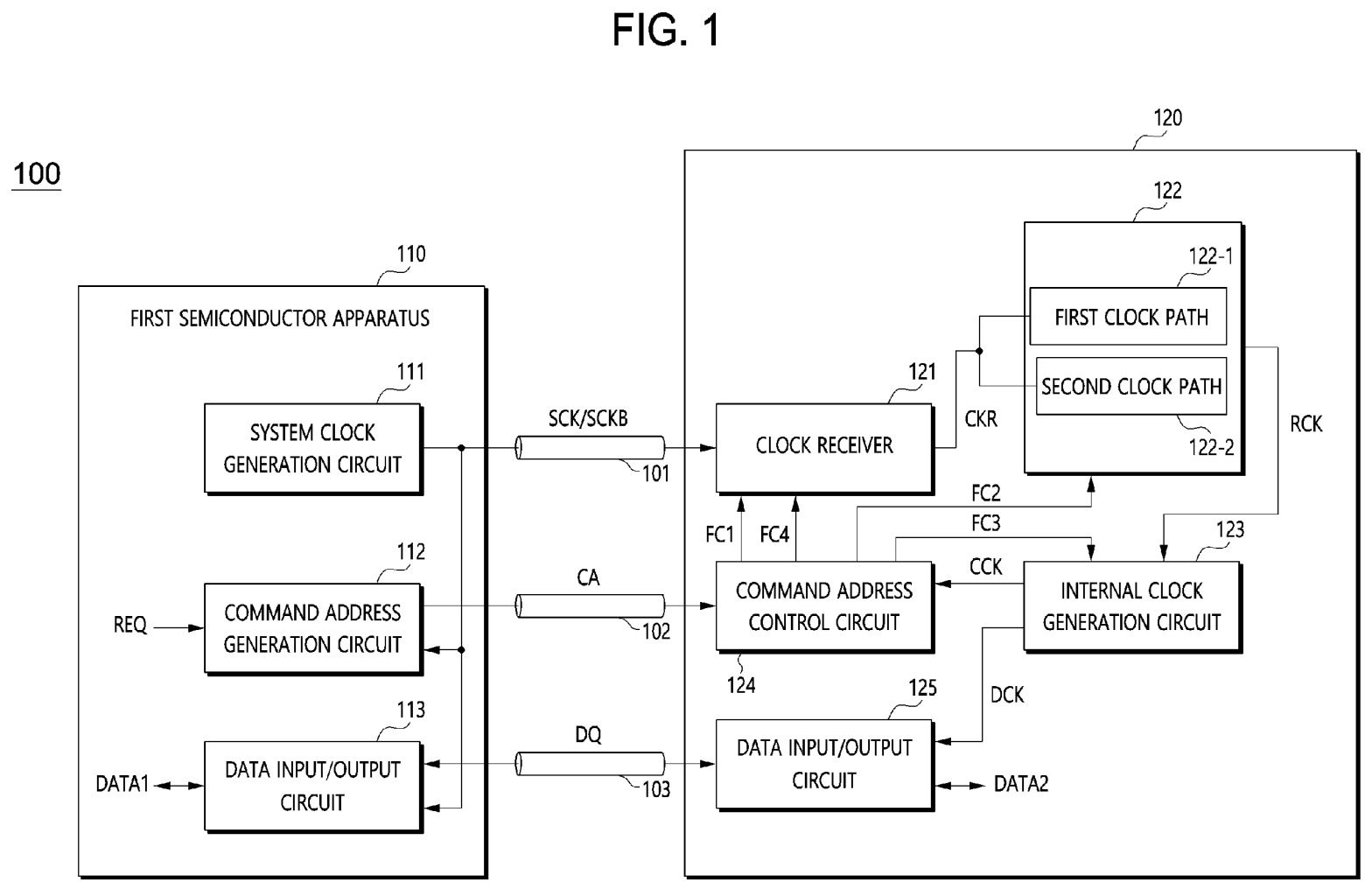

FIG. 1 is a block diagram illustrating a configuration of a semiconductor system 100 in accordance with an embodiment of the present disclosure. Referring to FIG. 1, the semiconductor system 100 may include a first semiconductor apparatus 110 and a second semiconductor apparatus 120. The first semiconductor apparatus 110 may be a master device that provides various control signals required for operating the second semiconductor apparatus 120. The second semiconductor apparatus 120 may be a slave device that performs various operations under the control of the first semiconductor apparatus 110. The first semiconductor apparatus 110 may include various types of host devices. For example, the first semiconductor apparatus 110 may include a central processing unit (CPU), a graphics processing unit (GPU), a multi-media processor (MMP), a digital signal processor, an application processor (AP), and a memory controller. The second semiconductor apparatus 120 may be, for example, a memory apparatus, and the memory apparatus may include a volatile memory and a nonvolatile memory. Examples of the volatile memory may include a static RAM (SRAM), a dynamic RAM (DRAM), and a synchronous DRAM (SDRAM), and examples of the nonvolatile memory may include a read only memory (ROM), a programmable ROM (PROM), an electrically erasable and programmable ROM (EEPROM), an erasable programmable ROM (EPROM), a flash memory, a phase change RAM (PRAM), a magnetic RAM (MRAM), a resistive RAM (RRAM), a ferroelectric RAM (FRAM), and the like.

The second semiconductor apparatus 120 may be coupled to the first semiconductor apparatus 110 through a plurality of buses. The plurality of buses may be signal transmission paths, links, or channels for transmitting signals. The plurality of buses may include a clock bus 101, a command address bus 102, a data bus 103, and the like. The clock bus 101 and the command address bus 102 may be unidirectional buses from the first semiconductor apparatus 110 to the second semiconductor apparatus 120, and the data bus 103 may be a bidirectional bus. The second semiconductor apparatus 120 may be coupled to the first semiconductor apparatus 110 through the clock bus 101, and may receive a system clock signal SCK through the clock bus 101. In an embodiment, the system clock signal SCK may be transmitted together with a system clock bar signal SCKB. The second semiconductor apparatus 120 may be coupled to the first semiconductor apparatus 110 through the command address bus 102, and may receive a command address signal CA from the first semiconductor apparatus 110 through the command address bus 102. The command address signal CA may include a plurality of bits. The first semiconductor apparatus 110 may transmit the command address signal CA based on the system clock signal SCK, and the second semiconductor apparatus 120 may receive the command address signal CA based on the system clock signal SCK. The first semiconductor apparatus 110 may transmit the command address signal CA in synchronization with the system clock signal SCK, and the second semiconductor apparatus 120 may synchronize the command address signal CA with the system clock signal SCK. The second semiconductor apparatus 120 may be coupled to the first semiconductor apparatus 110 through the data bus 103, and may receive data DQ from the first semiconductor apparatus 110 through the data bus 103 or transmit the data DQ to the first semiconductor apparatus 110 through the data bus 103. The first semiconductor apparatus 110 may transmit the data DQ to the second semiconductor apparatus 120 or receive the data DQ transmitted from the second semiconductor apparatus 120, in synchronization with the system clock signal SCK. The second semiconductor apparatus 120 may transmit the data DQ to the first semiconductor apparatus 110 or receive the data DQ transmitted from the first semiconductor apparatus 110, in synchronization with the system clock signal SCK.

The first semiconductor apparatus 110 may include a system clock generation circuit 111, a command address generation circuit 112, and a data input/output circuit 113. The system clock generation circuit 111 may generate the system clock signal SCK and the system clock bar signal SCKB. The system clock generation circuit 111 may include any clock generator for generating the system clock signal SCK. For example, the system clock generation circuit 111 may include an oscillator, a phase locked loop circuit, a delay locked loop circuit, and the like. The system clock generation circuit 111 may generate the system clock signal SCK having a frequency suitable for communication between the first and second semiconductor apparatuses 110 and 120. The system clock generation circuit 111 may transmit the system clock signal SCK to the second semiconductor apparatus 120 through the clock bus 101. The system clock generation circuit 111 may provide the system clock signal SCK to the command address generation circuit 112 and the data input/output circuit 113.

The command address generation circuit 112 may generate the command address signal CA based on a user's request REQ. The command address generation circuit 112 may generate the command address signal CA that instructs the second semiconductor apparatus 120 to perform various operations according to the request REQ. The command address generation circuit 112 may transmit the command address signal CA to the second semiconductor apparatus 120 through the command address bus 102. The command address generation circuit 112 may receive the system clock signal SCK, and transmit the command address signal CA to the command address bus 102 in synchronization with the system clock signal SCK. The first semiconductor apparatus 110 may provide information related to the frequency of the system clock signal SCK to the second semiconductor apparatus 120 as the command address signal CA. The command address generation circuit 112 may generate the command address signal CA having information related to the frequency of the system clock signal SCK. The information related to the frequency of the system clock signal SCK may be related to whether the frequency of the system clock signal SCK is high or low. For example, when the frequency of the system clock signal SCK changes in first to eighth frequency ranges, the command address generation circuit 112 may generate the command address signal CA having information on any one of the first to eighth frequency ranges to which the frequency of the system clock signal SCK belongs.

The data input/output circuit 113 may be coupled to the second semiconductor apparatus 120 through the data bus 103, and may transmit the data DQ to the second semiconductor apparatus 120 through the data bus 103 or receive the data DQ transmitted from the second semiconductor apparatus 120 through the data bus 103. The data input/output circuit 113 may generate the data DQ based on internal data DATA1 of the first semiconductor apparatus 110, and transmit the data DQ to the second semiconductor apparatus 120 through the data bus 103. The data input/output circuit 113 may receive the data DQ transmitted from the second semiconductor apparatus 120 through the data bus 103, and generate the internal data DATA1 based on the data DQ. The data input/output circuit 113 may receive the system clock signal SCK, and perform a data input/output operation based on the system clock signal SCK. The data input/output circuit 113 may transmit the internal data DATA1 of the first semiconductor apparatus 110 as the data DQ in synchronization with the system clock signal SCK, and generate the internal data DATA1 from the data DQ in synchronization with the system clock signal SCK.

The second semiconductor apparatus 120 may include a clock receiver 121, a clock path circuit 122, an internal clock generation circuit 123, a command address control circuit 124, and a data input/output circuit 125. The clock receiver 121 may be coupled to the clock bus 101, and may generate a received clock signal CKR by receiving the system clock signal SCK transmitted through the clock bus 101. When the system clock signal SCK is transmitted together with the system clock bar signal SCKB, the clock receiver 121 may generate the received clock signal CKR by differentially amplifying the system clock signal SCK and the system clock bar signal SCKB. When the system clock signal SCK is transmitted as a single-ended signal, the clock receiver 121 may generate the received clock signal CKR by differentially amplifying the system clock signal SCK and a reference voltage. The reference voltage may have a voltage level corresponding to the middle of a range in which the system clock signal SCK swings.

The clock path circuit 122 may receive the received clock signal CKR to generate a reference clock signal RCK. The clock path circuit 122 may generate the reference clock signal RCK by buffering the received clock signal CKR. The clock path circuit 122 may include a plurality of clock paths. The clock path circuit 122 may include at least a first clock path 122-1 and a second clock path 122-2. The first and second clock paths 122-1 and 122-2 may have different characteristics. For example, the first clock path 122-1 may allow a clock signal with a high frequency to propagate without loss and have relatively high power consumption. The second clock path 122-2 may allow a clock signal with a low frequency to propagate and have relatively low power consumption. The first clock path 122-1 may be a current mode logic (CML) clock path, and the second clock path 122-2 may be a complementary metal-oxide-semiconductor (CMOS) clock path. The first clock path 122-1 may buffer the received clock signal CKR at a CML level, and the second clock path 122-2 may buffer the received clock signal CKR at a CMOS level. The CML level may be a voltage level range smaller than that of the CMOS level, and a swing range of a signal that swings at a CML level may be smaller than a swing range of a signal that swings at the CMOS level. The clock path circuit 122 may allow the received clock signal CKR to propagate through one of the first and second clock paths 122-1 and 122-2 according to the frequency of the system clock signal SCK. When the frequency of the system clock signal SCK is high, the clock path circuit 122 may allow the received clock signal CKR to propagate through the first clock path 122-1, and when the frequency of the system clock signal SCK is low, the clock path circuit 122 may allow the received clock signal CKR to propagate through the second clock path 122-2. When the frequency of the system clock signal SCK is high, the clock path circuit 122 may allow the received clock signal CKR with a high frequency to propagate without loss, and when the frequency of the system clock signal SCK is low, the clock path circuit 122 may allow the received clock signal CKR with a low frequency to propagate while reducing power consumption. The clock path circuit 122 may output one of the output signal of the first clock path 122-1 and the output signal of the second clock path 122-2 as the reference clock signal RCK.

The internal clock generation circuit 123 may receive the reference clock signal RCK, and generate a plurality of internal clock signals based on the reference clock signal RCK. The internal clock generation circuit 123 may divide the frequency of the reference clock signal RCK, and generate a plurality of internal clock signals from the divided clock signal. The plurality of internal clock signals may include a command clock signal CCK and a data clock signal DCK. The internal clock generation circuit 123 may provide the command clock signal CCK to the command address control circuit 124, and provide the data clock signal DCK to the data input/output circuit 125. In an embodiment, the command clock signal CCK may have a lower frequency than the data clock signal DCK. The internal clock generation circuit 123 may include at least one division circuit capable of dividing the frequency of the reference clock signal RCK. In an embodiment, the internal clock generation circuit 123 may include a delay-locked loop circuit and/or a phase-locked loop circuit capable of compensating for a time for which the system clock signal SCK is delayed by the internal circuits of the second semiconductor apparatus 120. In an embodiment, the internal clock generation circuit 123 may include a command clock distribution network capable of distributing the command clock signal CCK to the command address control circuit 124. The internal clock generation circuit 123 may include a data clock distribution network capable of distributing the data clock signal DCK to the data input/output circuit 125.

The command address control circuit 124 may be coupled to the command address bus 102, and may receive the command address signal CA transmitted from the first semiconductor apparatus 110. The command address control circuit 124 may receive the command clock signal CCK from the internal clock generation circuit 123, and synchronize the command address signal CA with the command clock signal CCK. The command address control circuit 124 may decode the command address signal CA to generate an internal command signal and an internal address signal so that the second semiconductor apparatus 120 may perform various operations.

When the command address signal CA including the information related to the frequency of the system clock signal SCK is received from the first semiconductor apparatus 110, the command address control circuit 124 may generate at least one frequency control signal based on the command address signal CA. For example, the command address control circuit 124 may generate a first frequency control signal FC1, a second frequency control signal FC2, a third frequency control signal FC3, and a fourth frequency control signal FC4 based on the command address signal CA. The command address control circuit 124 may provide the first frequency control signal FC1 to the clock receiver 121. The clock receiver 121 may vary a gain of the clock receiver 121 based on the first frequency control signal FC1. For example, the clock receiver 121 may change the gain of the clock receiver 121 to a gain suitable for receiving the system clock signal SCK with a high frequency or a gain suitable for receiving the system clock signal SCK with a low frequency based on the first frequency control signal FC1. The command address control circuit 124 may provide the second frequency control signal FC2 to the clock path circuit 122. Based on the second frequency control signal FC2, the clock path circuit 122 may select a clock path through which the received clock CKR propagates. The clock path circuit 122 may select one of the first and second clock paths 122-1 and 122-2 based on the second frequency control signal FC2, and one of the first and second clock paths 122-1 and 122-2 may be activated based on the second frequency control signal FC2.

The command address control circuit 124 may provide the third frequency control signal FC3 to the internal clock generation circuit 123. The internal clock generation circuit 123 may adjust a setup and/or hold margin for generating the data clock signal DCK from the reference clock signal RCK based on the third frequency control signal FC3. The command address control circuit 124 may provide the fourth frequency control signal FC4 to at least one CML buffer included in the second semiconductor apparatus 120. For example, the clock receiver 121 may be a CML buffer and may further receive the fourth frequency control signal FC4. The fourth frequency control signal FC4 may also be provided to a CML buffer other than the clock receiver 121. The clock receiver 121 may change the current driving ability of the clock receiver 121 based on the fourth frequency control signal FC4. The clock receiver 121 may increase or decrease the current driving ability of generating the received clock signal CKR based on the fourth frequency control signal FC4.

The data input/output circuit 125 may be coupled to the first semiconductor apparatus 110 through the data bus 103, and may transmit the data DQ to the first semiconductor apparatus 110 through the data bus 103 or receive the data DQ transmitted from the first semiconductor apparatus 110 through the data bus 103. The data input/output circuit 125 may generate the data DQ based on internal data DATA2 of the second semiconductor apparatus 120, and transmit the data DQ to the first semiconductor apparatus 110 through the data bus 103. The data input/output circuit 125 may receive the data DQ transmitted from the first semiconductor apparatus 110 through the data bus 103, and generate the internal data DATA2 based on the data DQ. The data input/output circuit 125 may receive the data clock signal DCK generated from the internal clock generation circuit 123. The data input/output circuit 125 may perform an input/output operation of the data DQ based on the data clock signal DCK. The data input/output circuit 125 may transmit the data DQ to the first semiconductor apparatus 110 in synchronization with the data clock signal DCK, and receive the data DQ transmitted from the first semiconductor apparatus 110 in synchronization with the data clock signal DCK.

FIG. 2 is a block diagram illustrating the configuration of at least a part of a semiconductor apparatus 200 in accordance with an embodiment of the present disclosure. The semiconductor apparatus 200 may be applied as the second semiconductor apparatus 120 illustrated in FIG. 1. Referring to FIG. 2, the semiconductor apparatus 200 may include a frequency control circuit 211, a clock receiver 220, and a clock path circuit 230. The frequency control circuit 211 may generate at least one frequency control signal based on the command address signal CA. The command address signal CA may include the information related to the frequency of the system clock signal SCK. The command address signal CA may be transmitted from the first semiconductor apparatus 110 illustrated in FIG. 1. The semiconductor apparatus 200 may further include a command address receiver 212 that receives the command address signal CA. The command address receiver 212 and the frequency control circuit 211 may be included in the command address control circuit 124 illustrated in FIG. 1.

The frequency control circuit 211 may generate a frequency information signal based on the command address signal CA. The frequency information signal may have a plurality of bits and may have different values according to the frequency of the system clock signal SCK. For example, the system clock signal SCK may belong to any one of first to eighth frequency ranges, and the frequency information signal may have different values according to a frequency range to which the frequency of the system clock signal SCK belongs. The first frequency range may be the lowest frequency range, and the eighth frequency range may be the highest frequency range. The first to eighth frequency ranges might not overlap one another. The frequency control circuit 211 may further receive at least a first frequency setting signal FEN1. The frequency control circuit 211 may generate a first frequency control signal FC1 by comparing the frequency information signal with the first frequency setting signal FEN1. The first frequency setting signal FEN1 may specify a target frequency range. The first frequency setting signal FEN1 may include information corresponding to at least one of the first to eighth frequency ranges. The first frequency setting signal FEN1 may be a signal stored in another circuit of the semiconductor apparatus 200. For example, the first frequency setting signal FEN1 may be stored in a mode register or a programmable memory cell included in the semiconductor apparatus 200. When a frequency corresponding to the frequency information signal (that is, a frequency of the system clock signal SKC) is higher than a frequency corresponding to the first frequency setting signal FEN1, the frequency control circuit 211 may enable the first frequency control signal FC1. When the frequency corresponding to the frequency information signal is lower than the frequency corresponding to the first frequency setting signal FEN1, the frequency control circuit 211 may disable the first frequency control signal FC1. For example, the first frequency setting signal FEN1 is assumed to specify the fourth frequency range. When the frequency corresponding to the frequency information signal belongs to the first to third frequency ranges, the frequency control circuit 211 may maintain the first frequency control signal FC1 in a disabled state. When the frequency corresponding to the frequency information signal belongs to the fourth to eighth frequency ranges, the frequency control circuit 211 may enable the first frequency control signal FC1. The first frequency setting signal FEN1 may include the same number of bits as the number of bits of the frequency information signal.

The semiconductor apparatus 200 may further store a second frequency setting signal FEN2, a third frequency setting signal FEN3, and a fourth frequency setting signal FEN4, and the frequency control circuit 211 may further receive the second frequency setting signal FEN2, the third frequency setting signal FEN3, and the fourth frequency setting signal FEN4. The frequency control circuit 211 may further generate a second frequency control signal FC2, a third frequency control signal FC3, and a fourth frequency control signal FC4 based on the frequency information signal, the second frequency setting signal FEN2, the third frequency setting signal FEN3, and the fourth frequency setting signal FEN4. The frequency control circuit 211 may generate the second frequency control signal FC2 by comparing the frequency information signal with the second frequency setting signal FEN2. The frequency control circuit 211 may generate the third frequency control signal FC3 by comparing the frequency information signal with the third frequency setting signal FEN3. The frequency control circuit 211 may generate the fourth frequency control signal FC4 by comparing the frequency information signal with the fourth frequency setting signal FEN4. The first to fourth frequency setting signals FEN1 to FEN4 may have different values, or some or all of them may have the same value. Accordingly, the frequency control circuit 211 may independently enable the first to fourth frequency control signals FC1 to FC4 according to values of the first to fourth frequency setting signals FEN1 to FEN4. For example, when the second frequency setting signal FEN2 may specify the third frequency range, the third frequency setting signal FEN3 may specify the sixth frequency range, the fourth frequency setting signal FEN4 may specify the seventh frequency range, and the frequency corresponding to the frequency information signal belongs to the fifth frequency range, the frequency control circuit 211 may enable the first and second frequency control signals FC1 and FC2 and disable the third and fourth frequency control signals FC3 and FC4. In an embodiment, the first to fourth frequency setting signals FEN1 to FEN4 may specify the upper and lower limits of a target frequency range. For example, the fourth frequency setting signal FC4 may specify the target frequency range from the third frequency range to the fifth frequency range. In such a case, when the frequency corresponding to the frequency information signal belongs to the third to fifth frequency ranges, the frequency control circuit 211 may enable the fourth frequency control signal FC4. When the frequency corresponding to the frequency information signal belongs to the first and second frequency ranges or the sixth to eighth frequency ranges, the frequency control circuit 211 may disable the fourth frequency control signal FC4.

The clock receiver 220 may receive a system clock signal pair SCK and SCKB to generate a received clock signal pair CKR and CKRB. The clock receiver 220 may be a component corresponding to the clock receiver 121 illustrated in FIG. 1. The clock receiver 220 may generate the received clock signal CKR and the received clock bar signal CKRB by differentially amplifying the system clock signal SCK and the system clock bar signal SCKB. The clock receiver 220 may be a CML buffer. The clock receiver 220 may receive at least the first frequency control signal FC1. The clock receiver 220 may vary a gain of the clock receiver 220 based on the first frequency control signal FC1. When the first frequency control signal FC1 is enabled, the clock receiver 220 may increase an alternating current (AC) gain of the clock receiver 220. When the first frequency control signal FC1 is disabled, the clock receiver 220 may increase a direct current (DC) gain of the clock receiver 220. When the AC gain of the clock receiver 220 increases, the clock receiver 220 may be suitable for differentially amplifying the system clock signal pair SCK and SCKB having a relatively high frequency. When the DC gain of the clock receiver 220 increases, the clock receiver 220 may be suitable for differentially amplifying the system clock signal pair SCK and SCKB having a relatively low frequency. The clock receiver 220 may include various components for adjusting the gain of the clock receiver 220, and the various components will be described below. The clock receiver 220 may further receive the fourth frequency control signal FC4. The clock receiver 220 may vary the current driving ability of the clock receiver 220 based on the fourth frequency control signal FC4. When the fourth frequency control signal FC4 is enabled, the clock receiver 220 may increase the current driving ability of the clock receiver 220. When the fourth frequency control signal FC4 is disabled, the clock receiver 220 may decrease the current driving ability of the clock receiver 220. The current driving ability may be a current driving ability for the clock receiver 220 to generate the received clock signal pair CKR and CKRB.

The clock path circuit 230 may receive the received clock signal pair CKR and CKRB from the clock receiver 220, and generate a reference clock signal pair RCK and RCKB from the received clock signal pair CKR and CKRB. The clock path circuit 230 may be a component corresponding to the clock path circuit 122 illustrated in FIG. 1. The clock path circuit 230 may include a first clock path 231 and a second clock path 232. The first clock path 231 may be a CML clock path including a CML buffer, and the second clock path 232 may be a CMOS clock path including a CMOS buffer. The clock path circuit 230 may generate the reference clock signal pair RCK and RCKB by buffering the received clock signal pair CKR and CKRB through one of the first and second clock paths 231 and 232. The clock path circuit 230 may receive the second frequency control signal FC2. Based on the second frequency control signal FC2, the clock path circuit 230 may select a clock path through which the received clock signal pair CKR and CKRB propagates. When the second frequency control signal FC2 is enabled, the clock path circuit 230 may generate the reference clock signal pair RCK and RCKB by allowing the received clock signal pair CKR and CKRB to propagate through the first clock path 231. When the second frequency control signal FC2 is disabled, the clock path circuit 230 may generate the reference clock signal pair RCK and RCKB by allowing the received clock signal pair CKR and CKRB to propagate through the second clock path 232.

The first clock path 231 may be activated based on the second frequency control signal FC2. The first clock path 231 may be activated when the second frequency control signal FC2 is enabled and may be deactivated when the second frequency control signal FC2 is disabled. The second clock path 232 may be activated based on the second frequency control signal FC2. The second clock path 232 may be deactivated when the second frequency control signal FC2 is enabled and may be activated when the second frequency control signal FC2 is disabled. The first clock path 231 may include a first buffer 231-1 and a first level converter 231-2. The first buffer 231-1 may be a CML buffer. The first buffer 231-1 may receive the received clock signal pair CKR and CKRB, and buffer the received clock signal pair CKR and CKRB to generate an output signal that swings at a CML level. The first buffer 231-1 may receive the second frequency control signal FC2. The first buffer 231-1 may be activated when the second frequency control signal FC2 is enabled, and may be deactivated when the second frequency control signal FC2 is disabled. The first level converter 231-1 may receive the output signal of the first buffer 231-1. The first level converter 231-1 may convert the output signal into a first differential clock signal pair CKD1 and CKD1B that swings at a CMOS level. The first level converter 231-2 may be a CML to CMOS converter. In an embodiment, the first clock path 231 may further include one or more CML buffers coupled between the first buffer 231-1 and the first level converter 231-2. In an embodiment, the first buffer 231-1 may further receive the fourth frequency control signal FC4, and may adjust the current driving ability of the first buffer 231-1 based on the fourth frequency control signal FC4.

The second clock path 232 may include a second level converter 232-1 and a second buffer 232-2. The second level converter 232-1 may receive the received clock signal pair CKR and CKRB and convert the received clock signal pair CKR and CKRB into an output signal that swings at a CMOS level. The second level converter 232-1 may be a CML to CMOS converter. The second level converter 232-1 may receive the second frequency control signal FC2. The second level converter 232-1 may be deactivated when the second frequency control signal FC2 is enabled, and may be activated when the second frequency control signal FC2 is disabled. The second buffer 232-2 may be a CMOS buffer. The second buffer 232-2 may receive the output signal of the second level converter 232-1, and buffer the output signal to generate a second differential clock signal pair CKD2 and CKD2B. In an embodiment, the second clock path 232 may further include one or more CMSO buffers coupled between the second level converter 232-1 and the second buffer 232-2.

The clock path circuit 230 may further include a selection circuit 233. The selection circuit 233 may receive the first differential clock signal pair CKD1 and CKD1B and the second differential clock signal pair CKD2 and CKD2B from the first and second clock paths 231 and 232, respectively. The selection circuit 233 may receive the second frequency selection signal FC2. Based on the second frequency selection signal FC2, the selection circuit 233 may output one of the first differential clock signal pair CKD1 and CKD1B and the second differential clock signal pair CKD2 and CKD2B as the reference clock signal pair RCK and RCKB. When the second frequency selection signal FC2 is enabled, the selection circuit 233 may output the first differential clock signal pair CKD1 and CKD1B as the reference clock signal pair RCK and RCKB. When the second frequency selection signal FC2 is disabled, the selection circuit 233 may output the second differential clock signal pair CKD2 and CKD2B as the reference clock signal pair RCK and RCKB. The selection circuit 233 may include a first input terminal for receiving the first differential clock signal pair CKD1 and CKD1B, a second input terminal for receiving the second differential clock signal pair CKD2 and CKD2B, and an output terminal for outputting the reference clock signal pair RCK and RCKB, and may include a multiplexer that receives the second frequency control signal FC2 as a control signal.

The semiconductor apparatus 200 may further include an internal clock generation circuit 240. The internal clock generation circuit 240 may be a component corresponding to the internal clock generation circuit 123 illustrated in FIG. 1. The internal clock generation circuit 240 may receive the received clock signal pair CKR and CKRB and the reference clock signal pair RCK and RCKB, and generate a data clock signal DCK and a command clock signal CCK based on the received clock signal pair CKR and CKRB and the reference clock signal pair RCK and RCKB. The internal clock generation circuit 240 may include a third level converter 241, a first clock divider 242, a phase controller 243, a data clock generator 244, and a command clock generator 245. The third level converter 241 may receive the received clock signal pair CKR and CKRB, and convert the received clock signal pair CKR and CKRB into an output signal that swings at a CMOS level. The third level converter 241 may be a CML to CMOS converter. The first clock divider 242 may receive the output signal of the third level converter 241. The first clock divider 242 may generate a plurality of phase clock signals DVCK1 by dividing a frequency of the output signal. For example, the plurality of phase clock signals DVCK1 may include four phase clock signals sequentially having a phase difference of 90° among them. The plurality of phase clock signals DVCK1 may include a first phase clock signal generated from a rising edge of the received clock signal CKR, a second phase clock signal generated from a rising edge of the received clock bar signal CKRB, a third phase clock signal generated from a falling edge of the received clock signal CKR, and a fourth phase clock signal generated from a falling edge of the received clock bar signal CKRB.

The phase controller 243 may receive the plurality of phase clock signals DVCK1 from the first clock divider 232 and output one of the plurality of phase clock signals DVCK1. The phase controller 243 may receive the third frequency control signal FC3. The phase controller 243 may selectively output one of the plurality of phase clock signals DVCK1 based on the third frequency control signal FC3. For example, when the third frequency control signal FC3 is disabled, the phase controller 243 may output the first phase clock signal among the plurality of phase clock signals DVCK1. When the third frequency control signal FC3 is enabled, the phase controller 243 may output the fourth phase clock signal among the plurality of phase clock signals DVCK1. The fourth phase clock signal may have a phase ahead of the first phase clock signal. When the third frequency control signal FC3 is enabled, the phase controller 243 may provide the fourth phase clock signal with an earlier phase to the data clock generator 244, so that the data clock generator 244 may increase a setup and/or hold margin for generating the data clock signal DCK.

The data clock generator 244 may receive the reference clock signal pair RCK and RCKB from the clock path circuit 230, and receive the output signal of the phase controller 243. The data clock generator 244 may generate the data clock signal DCK based on the reference clock signal pair RCK and RCKB and the output signal of the phase controller 243. The data clock generator 244 may generate the data clock signal DCK by sampling the output signal of the phase controller 243 by using the reference clock signal RCK and the reference clock bar signal RCKB. The data clock signal DCK may have a lower frequency than the reference clock signal pair RCK and RCKB, and have the same frequency as the output signal of the phase controller 243. The data clock signal DCK may include a plurality of data clock signals sequentially having a phase difference of 90° among them. The data clock signal DCK may include a clock signal generated by sampling the output signal of the phase controller 243 at the rising edge of the reference clock signal RCK, a clock signal generated by sampling the output signal of the phase controller 243 at the rising edge of the reference clock bar signal RCKB, a clock signal generated by sampling the output signal of the phase controller 243 at the falling edge of the reference clock signal RCK, and a clock signal generated by sampling the output signal of the phase controller 243 at the falling edge of the reference clock bar signal RCKB. The data clock generator 244 may provide the data clock signal DCK to the data input/output circuit 125 illustrated in FIG. 1.

The command clock generator 245 may receive the plurality of phase clock signals DVCK1, and divide the frequencies of the plurality of phase clock signals DVCK1 to generate a divided clock signal DVCK2. The divided clock signal DVCK2 may have a lower frequency than the plurality of phase clock signals DVCK1. The command clock generator 245 may buffer the divided clock signal DVCK2 to generate the command clock signal CCK, and provide the command clock signal CCK to the command address receiver 212. The command address receiver 212 may receive the command address signal CA based on the command clock signal CCK. The command clock generator 245 may include a second clock divider 245-1 and a clock distribution circuit 245-2. The second clock divider 245-1 may generate the divided clock signal DVCK2 by dividing the frequencies of at least some of the plurality of phase clock signals DVCK1. For example, the second clock divider 254-1 may generate the divided clock signal by dividing the frequencies of the first and third phase clock signals. The clock distribution circuit 245-2 may buffer the divided clock signal DVCK2 and output the command clock signal CCK.

Figure 3:
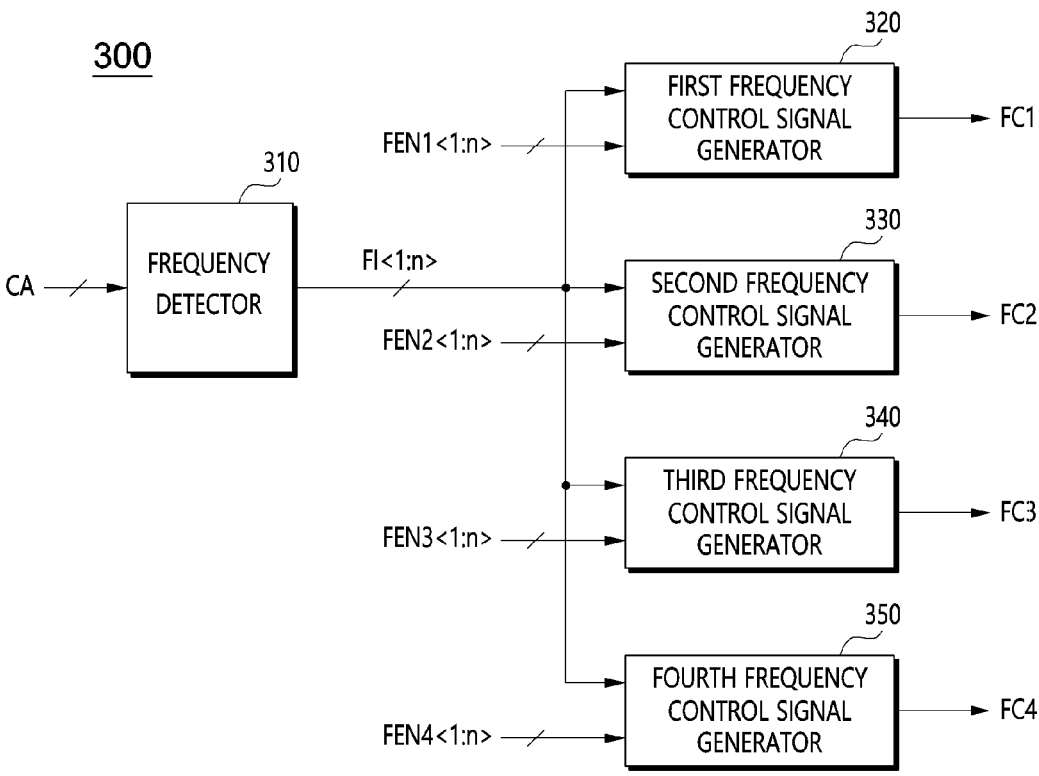
FIG. 3 is a block diagram illustrating a configuration of a frequency control circuit in accordance with an embodiment.

FIG. 3 is a diagram illustrating the configuration of a frequency control circuit 300 in accordance with an embodiment of the present disclosure. The frequency control circuit 300 may be applied as the frequency control circuit 211 illustrated in FIG. 2. Referring to FIG. 3, the frequency control circuit 300 may include a frequency detector 310 and a first frequency control signal generator 320. The frequency detector 310 may receive the command address signal CA, and generate a frequency information signal FI<1:n> based on the command address signal CA. The frequency detector 310 may generate the frequency information signal FI<1:n> by decoding the command address signal CA. Here, n may be an integer of 2 or more. When the frequency information signal FI<1:n> includes 8 bits, the frequency detector 310 may generate the frequency information signal FI<1:n> by decoding the command address signal CA having 3 bits or more. Hereinafter, a case in which the frequency information signal FI<1:n> includes 8 bits will be described as an example.

The first frequency control signal generator 320 may receive the frequency information signal FI<1:n> from the frequency detector 310, and receive a first frequency setting signal FEN1<1:n>. The first frequency setting signal FEN1<1:n> may include the same number of bits as the number of bits of the frequency information signal FI<1:n>, and the first frequency setting signal FEN1<1:n> may also include 8 bits. The first frequency control signal generator 320 may compare the frequency information signal FI<1:n> with the first frequency setting signal FEN1<1:n> to generate the first frequency control signal FC1. When a frequency corresponding to the frequency information signal FI<1:n> is higher than a frequency corresponding to the first frequency setting signal FEN1<1:n>, the first frequency control signal generator 320 may enable the first frequency control signal FC1. When the frequency corresponding to the frequency information signal FI<1:n> is lower than the frequency corresponding to the first frequency setting signal FEN1<1:n>, the first frequency control signal generator 320 may disable the first frequency control signal FC1.

The frequency control circuit 300 may further include a second frequency control signal generator 330, a third frequency control signal generator 340, and a fourth frequency control signal generator 350. The second frequency control signal generator 330 may receive the frequency information signal FI<1:n> from the frequency detector 310, and receive a second frequency setting signal FEN2<1:n>. The second frequency setting signal FEN2<1:n> may include 8 bits like the first frequency setting signal FEN1<1:n>. The second frequency control signal generator 330 may compare the frequency information signal FI<1:n> with the second frequency setting signal FEN2<1:n> to generate the second frequency control signal FC2. When the frequency corresponding to the frequency information signal FI<1:n> is higher than a frequency corresponding to the second frequency setting signal FEN2<1:n>, the second frequency control signal generator 330 may enable the second frequency control signal FC2. When the frequency corresponding to the frequency information signal FI<1:n> is lower than the frequency corresponding to the second frequency setting signal FEN2<1:n>, the second frequency control signal generator 330 may disable the second frequency control signal FC2.

The third frequency control signal generator 340 may receive the frequency information signal FI<1:n> from the frequency detector 310, and receive a third frequency setting signal FEN3<1:n>. The third frequency setting signal FEN3<1:n> may include 8 bits like the first frequency setting signal FEN1<1:n>. The third frequency control signal generator 340 may compare the frequency information signal FI<1:n> with the third frequency setting signal FEN3<1:n> to generate the third frequency control signal FC3. When the frequency corresponding to the frequency information signal FI<1:n> is higher than a frequency corresponding to the third frequency setting signal FEN3<1:n>, the third frequency control signal generator 340 may enable the third frequency control signal FC3. When the frequency corresponding to the frequency information signal FI<1:n> is lower than the frequency corresponding to the third frequency setting signal FEN3<1:n>, the third frequency control signal generator 340 may disable the third frequency control signal FC3.

The fourth frequency control signal generator 350 may receive the frequency information signal FI<1:n> from the frequency detector 310, and receive a fourth frequency setting signal FEN4<1:n>. The fourth frequency setting signal FEN4<1:n> may include 8 bits like the first frequency setting signal FEN1<1:n>. The fourth frequency control signal generator 350 may compare the frequency information signal FI<1:n> with the fourth frequency setting signal FEN4<1:n> to generate the fourth frequency control signal FC4. When the frequency corresponding to the frequency information signal FI<1:n> is higher than a frequency corresponding to the fourth frequency setting signal FEN4<1:n>, the fourth frequency control signal generator 350 may enable the fourth frequency control signal FC4. When the frequency corresponding to the frequency information signal FI<1:n> is lower than the frequency corresponding to the fourth frequency setting signal FEN4<1:n>, the fourth frequency control signal generator 350 may disable the fourth frequency control signal FC4.

Figure 4:
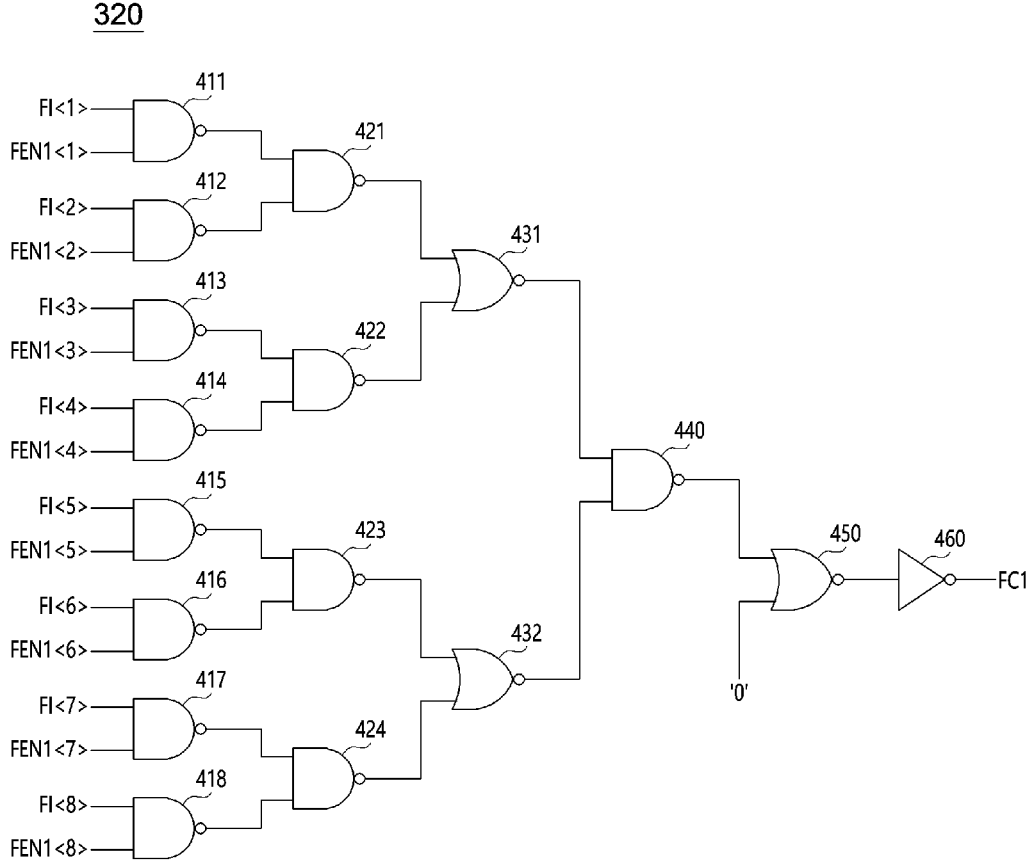
FIG. 4 is a diagram illustrating a configuration of a first frequency control signal generator illustrated in FIG. 3.

FIG. 4 is a diagram illustrating the configuration of the first frequency control signal generator 320 illustrated in FIG. 3. FIG. 4 may illustrate the configuration of the first frequency control signal generator 320 for generating the first frequency control signal FC1 from the frequency information signal FI<1:8> and the first frequency setting signal FEN1<1:8> each including 8 bits. The configuration of the first frequency control signal generator 320 may variously vary according to the number of bits included in the frequency information signal FI<1:n> and the first frequency setting signal FEN1<1:n> without departing from the operation principle of the first frequency control signal generator 320 illustrated in FIG. 4. The first frequency control signal generator 320 may include a first NAND gate 411, a second NAND gate 412, a third NAND gate 413, a fourth NAND gate 414, a fifth NAND gate 415, a sixth NAND gate 416, a seventh NAND gate 417, an eighth NAND gate 418, a ninth NAND gate 421, a tenth NAND gate 422, an eleventh NAND gate 423, a twelfth NAND gate 424, a first NOR gate 431, a second NOR gate 432, a thirteenth NAND gate 440, a third NOR gate 450, and an inverter 460. The first NAND gate 411 may receive a first bit FI<1> of the frequency information signal and a first bit FEN1<1> of the first frequency setting signal. The second NAND gate 412 may receive a second bit FI<2> of the frequency information signal and a second bit FEN1<2> of the first frequency setting signal. The third NAND gate 413 may receive a third bit FI<3> of the frequency information signal and a third bit FEN1<3> of the first frequency setting signal. The fourth NAND gate 414 may receive a fourth bit FI<4> of the frequency information signal and a fourth bit FEN1<4> of the first frequency setting signal. The fifth NAND gate 415 may receive a fifth bit FI<5> of the frequency information signal and a fifth bit FEN1<5> of the first frequency setting signal. The sixth NAND gate 416 may receive a sixth bit FI<6> of the frequency information signal and a sixth bit FEN1<6> of the first frequency setting signal. The seventh NAND gate 417 may receive a seventh bit FI<7> of the frequency information signal and a seventh bit FEN1<7> of the first frequency setting signal. The eighth NAND gate 418 may receive an eighth bit FI<8> of the frequency informa-tion signal and an eighth bit FEN1<8> of the first frequency setting signal.

The ninth NAND gate 421 may receive an output signal of the first NAND gate 411 and an output signal of the second NAND gate 412. The tenth NAND gate 422 may receive an output signal of the third NAND gate 413 and an output signal of the fourth NAND gate 414. The eleventh NAND gate 423 may receive an output signal of the fifth NAND gate 415 and an output signal of the sixth NAND gate 416. The twelfth NAND gate 424 may receive an output signal of the seventh NAND gate 417 and an output signal of the eighth NAND gate 418. The first NOR gate 431 may receive an output signal of the ninth NAND gate 421 and an output signal of the tenth NAND gate 422. The second NOR gate 432 may receive output signals of the eleventh NAND gate 423 and the twelfth NAND gate 424. The thirteenth NAND gate 440 may receive an output signal of the first NOR gate 431 and an output signal of the second NOR gate 432. The third NOR gate 450 may receive an output signal of the thirteenth NAND gate 440 and a signal ('0', for example, ground voltage) corresponding to a low logic level. The inverter 460 may invert an output signal of the third NOR gate 450 and output the first frequency control signal FC1.

The frequency information signal FI<1:8> may specify the frequency range of the system clock signal SCK of FIGS. 1 and 2. Bits of the frequency information signal FI<1:8> corresponding to a frequency range to which the frequency of the system clock signal SCK belongs among the first to eighth frequency ranges may each have a high logic level. For example, when the frequency of the system clock signal SCK belongs to the fourth frequency range, the fourth bit FI<4> of the frequency information signal may have a high logic level, and the first to third bits FI<1:3> and the fifth to eighth bits FI<5:8> of the frequency information signal may each have a low logic level. The first frequency setting signal FEN1<1:8> may set a target frequency range, and bits of the first frequency setting signal FEN1<1:8> corresponding to a frequency range equal to or greater than the target frequency range may each have a high logic level. For example, when the target frequency range is the fifth to eighth frequency ranges, the fifth to eighth bits FEN1<5:8> of the first frequency setting signal may each have a high logic level and the first to fourth bits FEN1<1:4> of the first frequency setting signal may each have a low logic level.

When a frequency range specified by the first frequency setting signal FEN1<1:8> is the fifth frequency range (that is, the first frequency setting signal FEN1<1:8> has a value of '0, 0, 0, 0, 1, 1, 1, 1') and the frequency corresponding to the frequency information signal FI<1:8> belongs to the fourth frequency range (that is, the frequency information signal FI<1:8> has a value of '0, 0, 0, 1, 0, 0, 0, 0'), the output signals of the first to eighth NAND gates 411 to 418 may all have a high logic level. The output signals of the ninth to twelfth NAND gates 421 to 424 may all have a low logic level, the output signals of the first and second NOR gates 431 and 432 may all have a high logic level, and the output signal of the thirteenth NAND gate 440 may have a low logic level. Accordingly, the first frequency control signal FC1 disabled at a low logic level may be generated through the third NOR gate 450 and the inverter 460. When the frequency corresponding to the frequency information signal FI<1:8> belongs to the sixth frequency range, the output signals of the first to fifth NAND gates 411 to 415, the seventh NAND gate 417, and the eighth NAND gate 418 may all have a high logic level, and the output signal of the sixth NAND gate 416 may have a low logic level. The output signals of the ninth NAND gate 421, the tenth NAND gate 422, and the twelfth NAND gate 424 may have a low logic level, but the output signal of the eleventh NAND gate 423 may have a high logic level. The output signal of the first NOR gate 431 may have a high logic level, the output signal of the second NOR gate 432 may have a low logic level, and the output signal of the thirteenth NAND gate 440 may have a high logic level. Accordingly, the first frequency control signal FC1 enabled at a high logic level may be generated through the third NOR gate 450 and the inverter 460. The second frequency control signal generator 330, the third frequency control signal generator 340, and the fourth frequency control signal generator 350 of FIG. 3 may include substantially the same configuration as the first frequency control signal generator 320 illustrated in FIG. 4, except for receiving the second frequency setting signal FEN1<1:n>, the third frequency setting signal FEN3<1:n>, and the fourth frequency setting signal FEN4<1:n> instead of the first frequency setting signal FEN1<1:n>.

Figure 5:
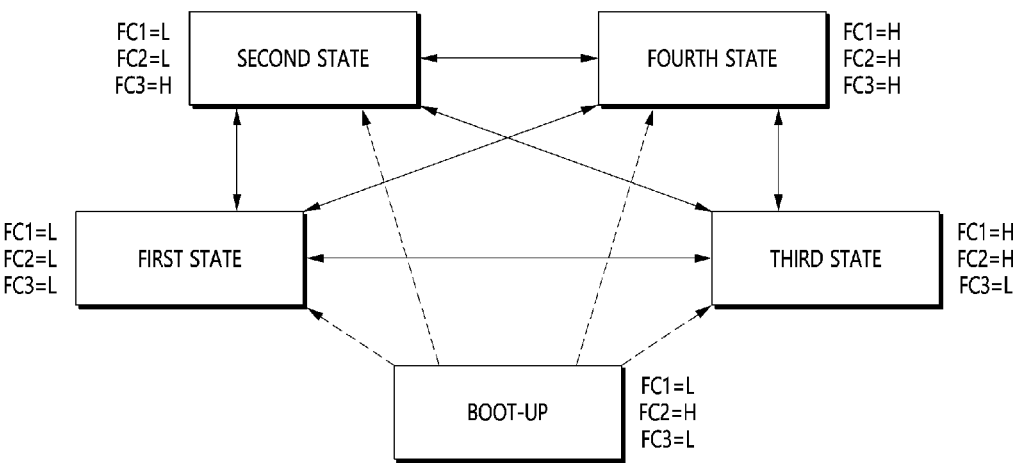
FIG. 5 is a diagram illustrating changes in the state of the semiconductor apparatus in accordance with an embodiment.

FIG. 5 is a diagram illustrating changes in the state of the semiconductor apparatus 200 in accordance with an embodi-ment of the present disclosure. Referring to FIGS. 2, 3, and 5, the semiconductor apparatus 200 may have a first state, a second state, a third state, and a fourth state. For example, the first state may be a state in which a first frequency corresponding to the frequency information signal FI<1:n> is lower than a frequency range corresponding to the first to third frequency setting signals FEN1<1:n>, FEN2<1:n>, and FEN3<1:n>, and the first to third frequency control signals FC1 to FC3 may be disabled at a low logic level. The second state may be a state in which a second frequency corresponding to the frequency information signal FI<1:n> is lower than a frequency range corresponding to the first and second frequency setting signals FEN1<1:n> and FEN2<1:n> and higher than a frequency range correspond-ing to the third frequency setting signal FEN3<1:n>, and the first and second frequency control signals FC1 and FC2 may be disabled at a low logic level and the third frequency control signal FC3 may be enabled at a high logic level. The third state may be a state in which a third frequency corresponding to the frequency information signal FI<1:n> is higher than the frequency range corresponding to the first and second frequency setting signals FEN1<1:n> and FEN2<1:n> and lower than the frequency range correspond-ing to the third frequency setting signal FEN3<1:n>, and the first and second frequency control signals FC1 and FC2 may be enabled at a high logic level and the third frequency control signal FC3 may be disabled at a low logic level. The fourth state may be a state in which a fourth frequency corresponding to the frequency information signal FI<1:n> is higher than the frequency range corresponding to the first to third frequency setting signals FEN1<1:n>, FEN2<1:n>, and FEN3<1:n>, and the first to third frequency control signals FC1 to FC3 may be enabled at a high logic level.

When the semiconductor apparatus 200 is booted up, the default value of the first frequency control signal FC1 within the semiconductor apparatus 200 may have a low logic level, the default value of the second frequency control signal FC2 may have a high logic level, and the default value of the third frequency control signal FC3 may have a low logic level. When the boot-up of the semiconductor apparatus 200 is completed and the command address signal CA including information related to the frequency of the system clock signal SCK is received, the frequency control circuit 300 may change the state of the semiconductor apparatus 200 to one of the first to fourth states by changing whether the first to third frequency control signals FC1 to FC3 are enabled. The command address signal CA including the information related to the frequency of the system clock signal SCK may be provided again at an arbitrary time point until the semiconductor apparatus 200 is powered off. When the semiconductor apparatus 200 receives the command address signal CA including the information related to the frequency of the system clock signal SCK, the frequency control circuit 300 may dynamically change the state of the semiconductor apparatus 200 from one state to another state by changing whether the first to third frequency control signals FC1 to FC3 are enabled, based on the command address signal CA. In an embodiment, the state of the semiconductor apparatus 200 may be changed according to the frequency of the system clock signal SCK, so that power consumption, characteristics, and/or performance of the clock receiver 220, the clock path circuit 230, and the internal clock generation circuit 240 may be optimized.

Figure 6:
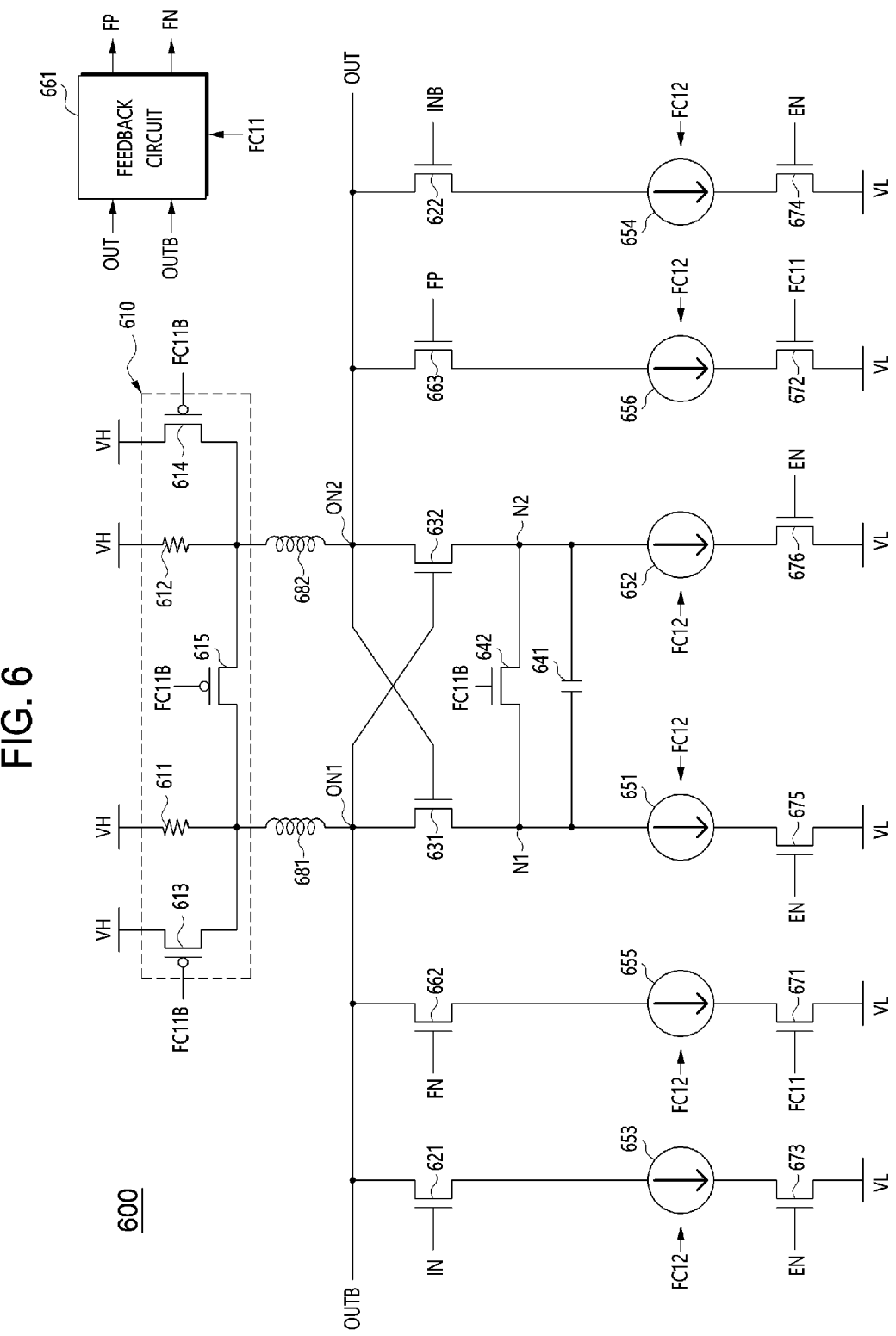
FIG. 6 is a diagram illustrating a configuration of a buffer circuit in accordance with an embodiment.

FIG. 6 is a diagram illustrating the configuration of a buffer circuit 600 in accordance with an embodiment of the present disclosure. The buffer circuit 600 may be applied as the clock receiver 220 illustrated in FIG. 2. Referring to FIG. 6, the buffer circuit 600 may operate by receiving a first power supply voltage VH and a second power supply voltage VL, and receive an input signal IN and an input bar signal INB to generate an output signal OUT and an output bar signal OUTB. The first power supply voltage VH may have a higher voltage level than the second power supply voltage VL. When the buffer circuit 600 is applied as the clock receiver 220, the input signal IN and the input bar signal INB may correspond to the system clock signal SCK and the system clock bar signal SCKB, respectively, and the output signal OUT and the output bar signal OUTB may correspond to the received clock signal CKR and the received clock bar signal CKRB, respectively. The buffer circuit 600 may adjust a gain of the buffer circuit 600 according to a frequency of the input signal IN. The buffer circuit 600 may receive a first frequency control signal FC11 and a second frequency control signal FC12 having enable state changes according to a frequency of the input signal IN. When the buffer circuit 600 is applied as the clock receiver 220, the first and second frequency control signals FC11 and FC12 may correspond to the first and fourth frequency control signals FC1 and FC4, respectively.

The buffer circuit 600 may include a load circuit 610, a first input transistor 621, a second input transistor 622, a first equalization transistor 631, a second equalization transistor 632, a capacitor 641, a switching transistor 642, a first current source 651, and a second current source 652. The load circuit 610 may receive the first power supply voltage VH. The load circuit 610 may be coupled between a node, to which the first power supply voltage VH is supplied, and a first output node ON1 and a second output node ON2. The first and second output nodes ON1, ON2 may receive the first power supply voltage through the load circuit 610. The output signal OUT may be output through the second output node ON2, and the output bar signal OUTB may be output through the first output node ON1. The first input transistor 621 may be connected between the first output node ON1 and the node to which the second power supply voltage VL is supplied, and may receive the input signal IN. The first input transistor 621 may change a voltage level of the first output node ON1 based on the input signal IN. The first input transistor 621 may be an N-channel MOS transistor. A gate of the first input transistor 621 may receive the input signal IN, a drain of the first input transistor 621 may be connected to the first output node ON1, and a source of the first input transistor 621 may be connected to the node to which the second power supply voltage VL is supplied. The second input transistor 622 may be connected between the second output node ON2 and the node to which the second power supply voltage VL is supplied, and may receive the input bar signal INB. The second input transistor 622 may change a voltage level of the second output node ON2 based on the input bar signal INB. The second input transistor 622 may be an N-channel MOS transistor. A gate of the second input transistor 622 may receive the input bar signal INB, a drain of the second input transistor 622 may be connected to the second output node ON2, and a source of the second input transistor 622 may be connected to the node to which the second power supply voltage VL is supplied.

The first equalization transistor 631 may connect the first output node ON1 to a first node N1 according to the voltage level of the second output node ON2. The first equalization transistor 631 may be an N-channel MOS transistor. A gate of the first equalization transistor 631 may be connected to the second output node ON2, a drain of the first equalization transistor 631 may be connected to the first output node ON1, and a source of the first equalization transistor 631 may be connected to the first node N1. The second equalization transistor 632 may connect the second output node ON2 to a second node N2 according to the voltage level of the first output node ON1. The second equalization transistor 632 may be an N-channel MOS transistor. A gate of the second equalization transistor 632 may be connected to the first output node ON1, a drain of the second equalization transistor 632 may be connected to the second output node ON2, and a source of the second equalization transistor 632 may be connected to the second node N2. The capacitor 641 may be connected between the first and second nodes N1 and N2. The switching transistor 642 may selectively connect the first and second nodes N1 and N2 based on the first frequency control signal FC11. The switching transistor 642 may be connected between the first and second nodes N1 and N2, and may receive a bar signal FC11B of the first frequency control signal. The switching transistor 642 may be connected in parallel with the capacitor 641 between the first and second nodes N1 and N2. The switching transistor 642 may be an N-channel MOS transistor. A gate of the switching transistor 642 may receive the bar signal FC11B of the first frequency control signal, and one of a drain and a source of the switching transistor 642 may be connected to the first node N1, and the other one of the drain and the source of the switching transistor 642 may be connected to the second node N2. The first current source 651 may be connected between the first node N1 and the node to which the second power supply voltage VL is supplied. The first current source 651 may cause current to flow from the first node N1 to the node to which the second power supply voltage VL is supplied. The second current source 652 may be connected between the second node N2 and the node to which the second power supply voltage VL is supplied. The second current source 652 may cause current to flow from the second node N2 to the node to which the second power supply voltage VL is supplied.

The switching transistor 642 may change the characteristics of the buffer circuit 600 based on the first frequency control signal FC11. The switching transistor 642 may electrically isolate the first and second nodes N1 and N2 from each other when the first frequency control signal FC11 is enabled, and may connect the first and second nodes N1 and N2 to each other when the first frequency control signal FC11 is disabled. When the switching transistor 642 is turned off and the first and second nodes N1 and N2 are not connected to each other, the first and second nodes N1 and N2 may be connected to each other through the capacitor 641. When the first and second nodes N1 and N2 are connected through the capacitor 641, because an equalization operation is performed on the first and second nodes N1 and N2 through the first and second equalizing transistors 631 and 632 and the capacitor 641, an AC gain of the buffer circuit 600 may increase and the buffer circuit 600 may have characteristics of a band-pass filter and/or a high-pass filter. When the switching transistor 642 is turned on and the first and second nodes N1 and N2 are connected to each other, the capacitor 641 might not affect changes in the voltage levels of the first and second nodes N1 and N2. Accordingly, the equalization operation might not be performed, a DC gain of the buffer circuit 600 may increase, and the buffer circuit 600 may have characteristics of a low-pass filter. When the frequency of the input signal IN is relatively high, the first frequency control signal FC11 may be enabled and the switching transistor 642 may increase the AC gain of the buffer circuit 600, so that the buffer circuit 600 may have characteristics suitable for amplifying the input signal IN having a high frequency. When the frequency of the input signal IN is relatively low, the first frequency control signal FC11 may be disabled and the switching transistor 642 may increase the DC gain of the buffer circuit 600, so that the buffer circuit 600 may have characteristics suitable for amplifying the input signal IN having a low frequency.

The load circuit 610 may receive the first frequency control signal FC11. The load circuit 610 may change a resistance value of the load circuit 610 based on the first frequency control signal FC11. The load circuit 610 may decrease the resistance value of the load circuit 610 when the first frequency control signal FC11 is enabled and increase the resistance value of the load circuit 610 when the first frequency control signal FC11 is disabled. When the resistance value of the load circuit 610 is decreased, the AC gain of the buffer circuit 600 may increase, and when the resistance value of the load circuit 610 is increased, the DC gain of the buffer circuit 600 may increase. The load circuit 610 may include a first resistor 611, a second resistor 612, a first load transistor 613, a second load transistor 614, and a third load transistor 615. The first resistor 611 may be connected between the node to which the first power supply voltage VH is supplied and the first output node ON1. The second resistor 612 may be connected between the node to which the first power supply voltage VH is supplied and the second output node ON2. The first resistor 611 may have substantially the same resistance value as the resistance value of the second resistor 612. The first load transistor 613 may connect the node to which the first power supply voltage VH is supplied to the first output node ON1 based on the first frequency control signal FC11. The first load transistor 613 may be a P-channel MOS transistor. A gate of the first load transistor 613 may receive the bar signal FC11B of the first frequency control signal, and a source of the first load transistor 613 may be connected to the node to which the first power supply voltage VH is supplied, and a drain of the first load transistor 613 may be connected to the first output node ON1. The second load transistor 614 may connect the node to which the first power supply voltage VH is supplied to the second output node ON2 based on the first frequency control signal FC11. The second load transistor 614 may be a P-channel MOS transistor. A gate of the second load transistor 614 may receive the bar signal FC11B of the first frequency control signal, and a source of the second load transistor 614 may be connected to the node to which the first power supply voltage VH is supplied, and a drain of the second load transistor 614 may be connected to the second output node ON2. The third load transistor 615 may connect the first and second output nodes ON1 and ON2 to each other based on the first frequency control signal FC11. The third load transistor 615 may be a P-channel MOS transistor. A gate of the third load transistor 615 may receive the bar signal FC11B of the first frequency control signal, and one of a source and a drain of the third load transistor 615 may be connected to the first output node ON1, and the other of the source and the drain of the third load transistor 615 may be connected to the second output node ON2.

When the first frequency control signal FC11 is disabled, the first to third load transistors 613 to 615 may all be turned off. When the first to third load transistors 613 to 615 are all turned off, the resistance value between the node to which the first power supply voltage VH is supplied and the first output node ON1 may be substantially the same as the resistance value of the resistor 611, and the resistance value between the node to which the first power supply voltage VH is supplied and the second output node ON2 may be substantially the same as the resistance value of the second resistor 612. When the first frequency control signal FC11 is enabled, the first to third load transistors 613 to 615 may all be turned on. When the first to third load transistors 613 to 615 are all turned on, the current path from the node to which the first power supply voltage VH is supplied to the first output node ON1 may be bypassed to the turned load transistor 613, and the current path from the node to which the first power supply voltage VH is supplied to the second output node ON2 may be bypassed to the turned-on second load transistor 614. The third load transistor 615 may connect the first and second output nodes ON1 and ON2 to each other. Accordingly, the first load transistor 613 and the second load transistor 614 may be connected in parallel. The resistance value between the node to which the first power supply voltage VH is supplied and the second output node ON2 may be a parallel resistance value of a turn-on resistance value of the first and second load transistors 613 and 614. When the first frequency control signal FC11 is enabled, the first to third load transistors 613 to 615 may decrease the resistance value of the load circuit 610 and increase the amount of current supplied from the node to which the first power supply voltage VH is supplied to the first and second output nodes ON1 and ON2. When the first frequency control signal FC11 is disabled, the first to third load transistors 613 to 615 may increase the resistance value of the load circuit 610 and increase the amount of current supplied from the node to which the first power supply voltage VH is supplied to the first and second output nodes ON1 and ON2.

The buffer circuit 600 may further include a third current source 653 and a fourth current source 654. The third current source 653 may be connected between the first input transistor 621 and the node to which the second power supply voltage VL is supplied. The third current source 653 may cause current to flow from the source of the first input transistor 621 to the node to which the second power supply voltage VL is supplied. The fourth current source 654 may be connected between the second input transistor 622 and the node to which the second power supply voltage VL is supplied. The fourth current source 654 may cause current to flow from the source of the second input transistor 622 to the node to which the second power supply voltage VL is supplied. The amount of current of the third current source 653 may be substantially the same as the amount of current of the fourth current source 654. The third and fourth current sources 653 and 654 may receive the second frequency control signal FC12, and the amount of current of the third current source 653 and the amount of current of the fourth current source 654 may be varied based on the second frequency control signal FC12. For example, when the second frequency control signal FC12 is enabled, the third and fourth current sources 653 and 654 may increase the amount of current of the third current source 653 and the amount of current of the fourth current source 654, respectively. When the second frequency control signal FC12 is disabled, the third and fourth current sources 653 and 654 may decrease the amount of current of the third current source 653 and the amount of current of the fourth current source 654, respectively. When the amount of current of the third current source 653 and the amount of current of the fourth current source 654 are increased, the current driving ability of the buffer circuit 600 may be increased, thereby increasing the rate of voltage change of the first and second output nodes ON1 and ON2 and/or the transition slopes of the first and second output nodes ON1 and ON2. When the amount of current of the third current source 653 and the amount of current of the fourth current source 654 are decreased, the current driving ability of the buffer circuit 600 may be decreased, thereby decreasing the rate of voltage change of the first and second output nodes ON1 and ON2 and/or the transition slopes of the first and second output nodes ON1 and ON2.

In an embodiment, the first and second current sources 651 and 652 may receive the second frequency control signal FC12, and the amount of current of the first current source 651 and the amount of current of the second current source 652 may be varied based on the second frequency control signal FC12. For example, when the second frequency control signal FC12 is enabled, the first and second current sources 651 and 652 may increase the amount of current of the first current source 651 and the amount of current of the second current source 652, respectively. When the second frequency control signal FC12 is disabled, the first and second current sources 651 and 652 may decrease the amount of current of the first current source 651 and the amount of current of the second current source 652, respectively. When the amount of current of the first current source 651 and the amount of current of the second current source 652 are increased, the rate of changes in the voltage levels of the first and second nodes N1 and N2 may be increased, and the current driving ability of equalizing the first and second output nodes ON1 and ON2 by the first and second equalizing transistors 631 and 632 and the capacitor 641 may be increased. Accordingly, when the amount of current of the first current source 651 and the amount of current of the second current source 652 are increased, the AC gain of the buffer circuit 600 may be additionally increased.

The buffer circuit 600 may further include a feedback circuit 661, a third input transistor 662, and a fourth input transistor 663. The feedback circuit 661 may receive the output signal OUT and the output bar signal OUTB to generate a first feedback signal FP and a second feedback signal FN. The feedback circuit 661 may generate the first and second feedback signals FP and FN by differentially amplifying the output signal OUT and the output bar signal OUTB. The first feedback signal FP may be changed to the same logic level as the logic level of the output signal OUT, and the second feedback signal FN may be changed to the same logic level as the logic level of the output bar signal. The feedback circuit 661 may receive the first frequency control signal FC11 and be selectively activated based on the first frequency control signal FC11. When the first frequency control signal FC11 is enabled, the feedback circuit 661 may be activated and may generate the first and second feedback signals FP and FN from the output signal OUT and the output bar signal OUTB. When the first frequency control signal FC11 is disabled, the feedback circuit 661 may be deactivated and might not generate the first and second feedback signals FP and FN.

The third input transistor 662 may receive the second feedback signal FN, and be connected between the first output node ON1 and the node to which the second power supply voltage VL is supplied. The third input transistor 662 may change the voltage level of the first output node ON1 based on the second feedback signal FN. The third input transistor 662 may be an N-channel MOS transistor. A gate of the third input transistor 662 may receive the second feedback signal FN, a drain of the third input transistor 662 may be connected to the first output node ON1, and a source of the third input transistor 662 may be connected to the node to which the second power supply voltage VL is supplied. The fourth input transistor 663 may receive the first feedback signal FP and be connected between the second output node ON2 and the node to which the second power supply voltage VL is supplied. The fourth input transistor 663 may change the voltage level of the second output node ON2 based on the first feedback signal FP. The fourth input transistor 663 may be an N-channel MOS transistor. A gate of the fourth input transistor 663 may receive the first feedback signal FP, a drain of the fourth input transistor 663 may be connected to the second output node ON2, and a source of the fourth input transistor 663 may be connected to the node to which the second power supply voltage VL is supplied. The third input transistor 662 may accelerate changes in the voltage level of the first output node ON1 based on the second feedback signal FN, and the fourth input transistor 663 may accelerate changes in the voltage level of the second output node ON2 based on the first feedback signal FP. Accordingly, when the first frequency control signal FC11 is enabled, the feedback circuit 661, the third input transistor 662, and the fourth input transistor 663 may additionally increase the AC gain of the buffer circuit 600.

The buffer circuit 600 may further include a fifth current source 655 and a sixth current source 656. The fifth current source 655 may be connected between the third input transistor 662 and the node to which the second power supply voltage VL is supplied. The fifth current source 655 may cause current to flow from the source of the third input transistor 662 to the node to which the second power supply voltage VL is supplied. The sixth current source 656 may be connected between the fourth input transistor 663 and the node to which the second power supply voltage VL is supplied. The sixth current source 656 may cause current to flow from the source of the fourth input transistor 663 to the node to which the second power supply voltage VL is supplied. The amount of current of the fifth current source 655 may be substantially the same as the amount of current of the sixth current source 656. The fifth and sixth current sources 655 and 656 may receive the second frequency control signal FC12 and the amount of current of the fifth current source 655 and the amount of current of the sixth current source 656 may be varied based on the second frequency control signal FC12. For example, when the second frequency control signal FC12 is enabled, the fifth and sixth current sources 655 and 656 may increase the amount of current of the fifth current source 655 and the amount of current of the sixth current source 656, respectively. When the second frequency control signal FC12 is disabled, the fifth and sixth current sources 655 and 656 may decrease the amount of current of the fifth current source 655 and the amount of current of the sixth current source 656, respectively. When the amount of current of the fifth current source 655 and the amount of current of the sixth current source 656 are increased, the current driving ability of the buffer circuit 600 may be increased, thereby increasing the rate of voltage change of the first and second output nodes ON1 and ON2 and/or the transition slopes of the first and second output nodes ON1 and ON2. When the amount of current of the fifth current source 655 and the amount of current of the sixth current source 656 are decreased, the current driving ability of the buffer circuit 600 may be decreased, thereby decreasing the rate of voltage change of the first and second output nodes ON1 and ON2 and/or the transition slopes of the first and second output nodes ON1 and ON2.

The buffer circuit 600 may further include a first transistor 671 and a second transistor 672. The first transistor 671 may be connected between the fifth current source 655 and the node to which the second power supply voltage VL is supplied, and may receive the first frequency control signal FC11. The first transistor 671 may selectively connect the fifth current source 655 to a node, to which the second power supply voltage VL is supplied, based on the first frequency control signal FC11, thereby selectively activating the current path formed from the first output node ON1 to the node to which the second power supply voltage VL is supplied, through the third input transistor 662 and the fifth current source 655. The first transistor 671 may be an N-channel MOS transistor. A gate of the first transistor 671 may receive the first frequency control signal FC11, a drain of the first transistor 671 may be connected to the fifth current source 655, and a source of the first transistor 671 may be connected to the node to which the second power supply voltage VL is supplied. The second transistor 672 may be connected between the sixth current source 656 and the node to which the second power supply voltage VL is supplied, and may receive the first frequency control signal FC11. The second transistor 672 may selectively connect the sixth current source 656 to a node, to which the second power supply voltage VL is supplied, based on the first frequency control signal FC11, thereby selectively activating the current path formed from the second output node ON2 to the node to which the second power supply voltage VL is supplied, through the fourth input transistor 663 and the sixth current source 656. The second transistor 672 may be an N-channel MOS transistor. A gate of the second transistor 672 may receive the first frequency control signal FC11, a drain of the second transistor 672 may be connected to the sixth current source 656, and a source of the second transistor 672 may be connected to the node to which the second power supply voltage VL is supplied.

The buffer circuit 600 may further include a third transistor 673, a fourth transistor 674, a fifth transistor 675, and a sixth transistor 676. The third transistor 673 may be connected between the third current source 653 and the node to which the second power supply voltage VL is supplied, and may receive an enable signal EN. The enable signal EN may be a signal that activates the buffer circuit 600, and may be a signal that is enabled during a period in which the buffer circuit 600 operates. When the enable signal EN is enabled, the third transistor 673 may activate the current path formed from the first output node ON1 to the node where the second power supply voltage VL is supplied, through the first input transistor 621 and the third current source 653. The third transistor 673 may be an N-channel MOS transistor. A gate of the third transistor 673 may receive the enable signal EN, a drain of the third transistor 673 may be connected to the third current source 653, and a source of the third transistor 673 may be connected to the node to which the second power supply voltage VL is supplied. The fourth transistor 674 may be connected between the fourth current source 654 and the node to which the second power supply voltage VL is supplied, and may receive the enable signal EN. When the enable signal EN is enabled, the fourth transistor 674 may activate the current path from the second output node ON2 to the node to which the second power supply voltage VL is supplied, through the second input transistor 622 and the fourth current source 654. The fourth transistor 674 may be an N-channel MOS transistor. A gate of the fourth transistor 674 may receive the enable signal EN, a drain of the fourth transistor 674 may be connected to the fourth current source 654, and a source of the fourth transistor 674 may be connected to the node to which the second power supply voltage VL is supplied.

The fifth transistor 675 may be connected between the first current source 651 and the node to which the second power supply voltage VL is supplied, and may receive the enable signal EN. When the enable signal EN is enabled, the fifth transistor 675 may activate the current path formed from the first node N1 to the node to which the second power supply voltage VL is supplied, through the first current source 651. The fifth transistor 675 may be an N-channel MOS transistor. A gate of the fifth transistor 675 may receive the enable signal EN, a drain of the fifth transistor 675 may be connected to the first current source 651, and a source of the fifth transistor 675 may be connected to the node to which the second power supply voltage VL is supplied. The sixth transistor 676 may be connected between the second current source 652 and the node to which the second power supply voltage VL is supplied, and may receive the enable signal EN. When the enable signal EN is enabled, the sixth transistor 676 may activate the current path from the second node N2 to the node to which the second power supply voltage VL is supplied, through the second current source 652. The sixth transistor 676 may be an N-channel MOS transistor. A gate of the sixth transistor 676 may receive the enable signal EN, a drain of the sixth transistor 676 may be connected to the second current source 652, and a source of the sixth transistor 676 may be connected to the node to which the second power supply voltage VL is supplied.

The buffer circuit 600 may further include a first inductor 681 and a second inductor 682. The first inductor 681 may be connected between the load circuit 610 and the first output node ON1. The first inductor 681 may be connected between the drain of the first load transistor 613 and the first output node ON1. The second inductor 682 may be connected between the load circuit 610 and the second output node ON2. The second inductor 682 may be connected between the drain of the second load transistor 614 and the second output node ON2. When the first and second inductors 681 and 682 are provided, the third load transistor 615 may be connected between the drains of the first and second load transistors 613 and 614. The first inductor 681 may have substantially the same inductance as the inductance of the second inductor 682. In an embodiment, because the first and second inductors 681 and 682 may delay times for which current supplied through the load circuit 610 from the node, to which the first power supply voltage VH is supplied, is supplied to the first and second output nodes ON1 and ON2, respectively, when the voltage levels of the first and second output nodes ON1 and ON2 are transitioned, shunt peaking or inductive peaking may be formed and the AC gain of the buffer circuit 600 may be increased.

Figure 7:
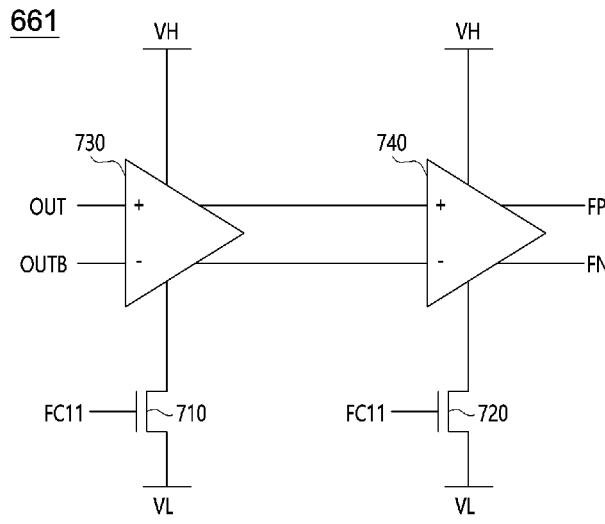
FIG. 7 is a diagram illustrating a configuration of a feedback circuit illustrated in FIG. 6.

FIG. 7 is a diagram illustrating the configuration of the feedback circuit 661 illustrated in FIG. 6. Referring to FIG. 7, the feedback circuit 661 may include a first transistor 710, a second transistor 720, a first amplifier 730, and a second amplifier 740. The first transistor 710 may selectively activate the first amplifier 730 based on the first frequency control signal FC11. The first transistor 710 may receive the first frequency control signal FC11, and provide the second power supply voltage VL to the first amplifier 730 based on the first frequency control signal FC11. The first transistor 710 may be an N-channel MOS transistor, and a gate of the first transistor 710 may receive the first frequency control signal FC11. When the first frequency control signal FC11 is enabled, the first transistor 710 may activate the first amplifier 730 by providing the second power supply voltage VL to the first amplifier 730. When the first frequency control signal FC11 is disabled, the first transistor 710 may deactivate the first amplifier 730 without providing the second power supply voltage VL to the first amplifier 730. The second transistor 720 may selectively activate the second amplifier 740 based on the first frequency control signal FC11. The second transistor 720 may receive the first frequency control signal FC11, and provide the second power supply voltage VL to the second amplifier 740 based on the first frequency control signal FC11. The second transistor 720 may be an N-channel MOS transistor, and a gate of the second transistor 720 may receive the first frequency control signal FC11. When the first frequency control signal FC11 is enabled, the second transistor 720 may activate the second amplifier 740 by providing the second power supply voltage VL to the second amplifier 740. When the first frequency control signal FC11 is disabled, the second transistor 720 may deactivate the second amplifier 740 without providing the second power supply voltage VL to the second amplifier 740.

The first amplifier 730 may receive the first power supply voltage VH, and receive the second power supply voltage VL through the first transistor 710. The first amplifier 730 may be activated when the second power supply voltage VL is received through the first transistor 710. The first amplifier 730 may receive the output signal OUT and the output bar signal OUTB. The first amplifier 730 may output an amplified signal pair by differentially amplifying the output signal OUT and the output bar signal OUTB. The second amplifier 740 may receive the first power supply voltage VH, and receive the second power supply voltage VL through the second transistor 720. The second amplifier 740 may be activated when the second power supply voltage VL is received through the second transistor 720. The second amplifier 740 may receive the amplified signal pair output from the first amplifier 730. The second amplifier 740 may output the first feedback signal FP and the second feedback signal FN by differentially amplifying the amplified signal pair.

Figure 8:
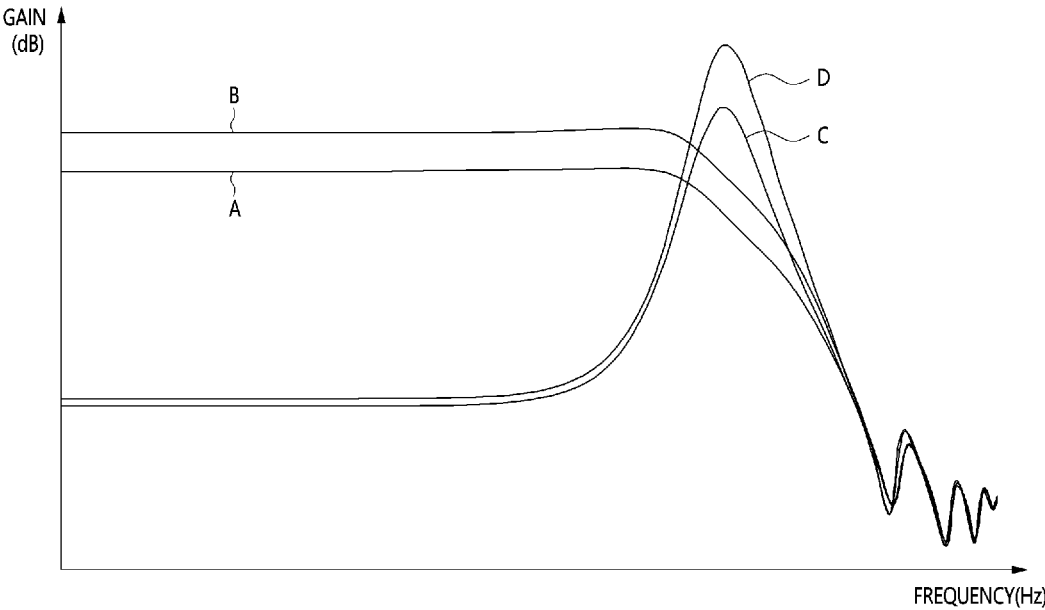
FIG. 8 is a graph illustrating changes in a gain of the buffer circuit in accordance with an embodiment.

FIG. 8 is a graph illustrating changes in the gain of the buffer circuit 600 in accordance with an embodiment of the present disclosure. The operation of the buffer circuit 600 in accordance with an embodiment of the present disclosure will be described below with reference to FIGS. 6 to 8. When the frequencies of the input signal IN and the input bar signal INB are relatively low, the first frequency control signal FC11 may be disabled. When the first frequency control signal FC11 is disabled, the switching transistor 642 may be turned on and may electrically connect the first and second nodes N1 and N2. Furthermore, the feedback circuit 661 may be deactivated based on the first frequency control signal FC11, and the first to third load transistors 613 to 615 may increase the resistance value of the load circuit 610 based on the first frequency control signal FC11. Accordingly, the buffer circuit 600 may increase the AC gain of the buffer circuit 600 as indicated by A and have a gain suitable for buffering the input signal IN and the input bar signal INB each having a relatively low frequency. Additionally, when the second frequency control signal FC12 is disabled, the first to sixth current sources 651 to 656 may decrease the amount of current of the first to sixth current sources 651 to 656, respectively. Accordingly, the buffer circuit 600 may further increase the DC gain of the buffer circuit 600 as indicated by B.

When the frequencies of the input signal IN and the input bar signal INB are relatively high, the first frequency control signal FC11 may be enabled. When the first frequency control signal FC11 is enabled, the switching transistor 642 may be turned off and the first and second nodes N1 and N2 may be connected to each other through the capacitor 641. The first to third load transistors 613 to 615 may all be turned on, and the resistance value of the load circuit 610 may be decreased. The feedback circuit 661 may be activated based on the first frequency control signal FC11 to generate the first and second feedback signals FP and FN, the voltage level of the second output node ON2 may be additionally changed based on the first feedback signal FP, and the voltage level of the first output node ON1 may be additionally changed based on the second feedback signal FN. Accordingly, the buffer circuit 600 may increase the AC gain as indicated by C and have a gain suitable for buffering the input signal IN and the input bar signal INB each having a relatively high frequency. When the second frequency control signal FC12 is enabled together, the first to sixth current sources 651 to 656 may increase the amount of current of the first to sixth current sources 651 to 656 based on the second frequency control signal FC12, respectively. Accordingly, the buffer circuit 600 may further increase the AC gain of the buffer circuit 600 as indicated by D.

Figure 9:
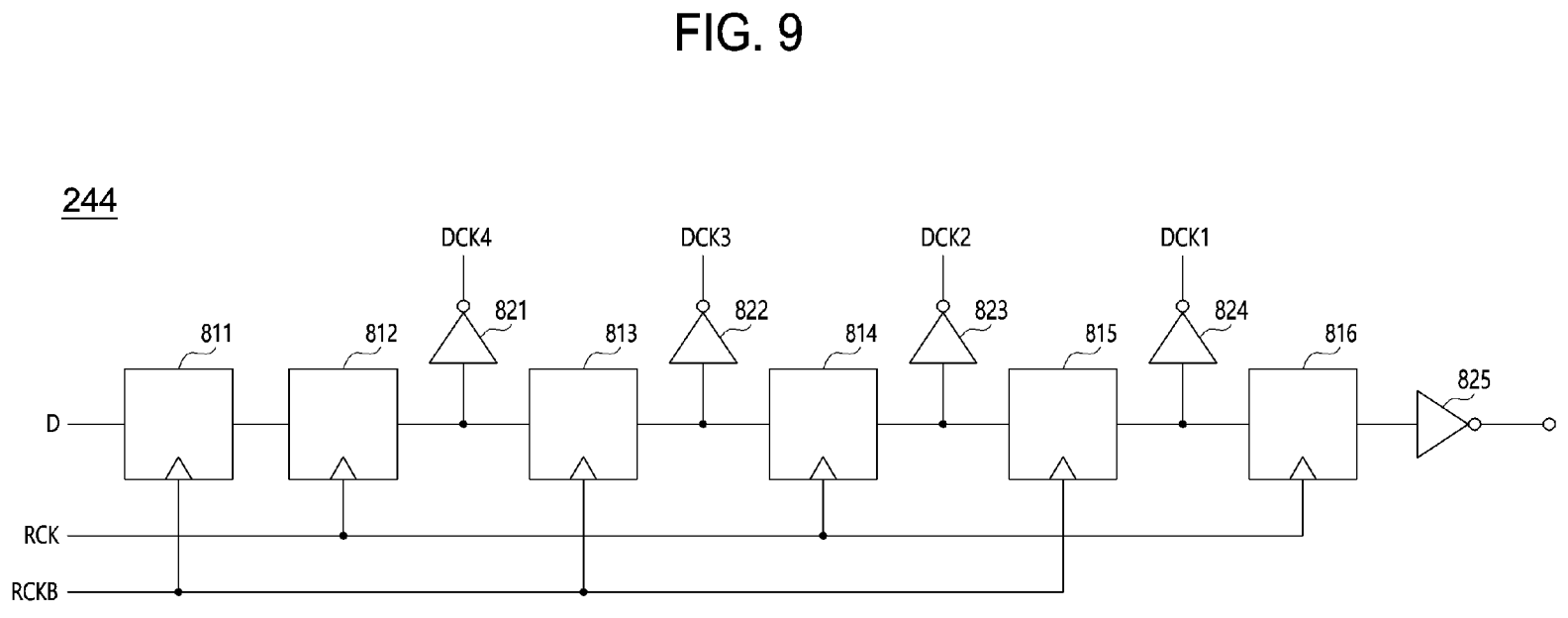

FIG. 9 is a diagram illustrating the configuration of the data clock generator 244 illustrated in FIG. 2. Referring to FIG. 9, the data clock generator 244 may include a first latch 811, a second latch 812, a third latch 813, a fourth latch 814, a fifth latch 815, a sixth latch 816, a first inverter 821, a second inverter 822, a third inverter 823, a fourth inverter 824, and a fifth inverter 825. The first latch 811 may receive an output signal D of the phase controller 243 and the reference clock bar signal RCKB. The first latch 811 may latch the voltage level of the output signal D of the phase controller 243 in synchronization with the rising edge of the reference clock bar signal RCKB. The second latch 812 may receive an output signal of the first latch 811 and the reference clock signal RCK. The second latch 812 may latch the voltage level of the output signal of the first latch 811 in synchronization with the rising edge of the reference clock signal RCK. The third latch 813 may receive an output signal of the second latch 812 and the reference clock bar signal RCKB. The third latch 813 may latch the voltage level of the output signal of the second latch 812 in synchronization with the rising edge of the reference clock bar signal RCKB. The fourth latch 814 may receive an output signal of the third latch 813 and the reference clock signal RCK. The fourth latch 814 may latch the voltage level of the output signal of the third latch 813 in synchronization with the rising edge of the reference clock signal RCK. The fifth latch 815 may receive an output signal of the fourth latch 814 and the reference clock bar signal RCKB. The fifth latch 815 may latch the voltage level of the output signal of the fourth latch 814 in synchronization with the rising edge of the reference clock bar signal RCKB. The sixth latch 816 may receive an output signal of the fifth latch 815 and the reference clock signal RCK. The sixth latch 816 may latch the voltage level of the output signal of the fifth latch 815 in synchronization with the rising edge of the reference clock signal RCK.

The data clock signal DCK may include a first data clock signal DCK1, a second data clock signal DCK2, a third data clock signal DCK3, and a fourth data clock signal DCK4. The first inverter 821 may receive the output signal of the second latch 812. The first inverter 821 may generate the fourth data clock signal DCK4 by inverting the output signal of the second latch 812. The second inverter 822 may receive the output signal of the third latch 813. The second inverter 822 may generate the third data clock signal DCK3 by inverting the output signal of the third latch 813. The third inverter 823 may receive the output signal of the fourth latch 814. The third inverter 823 may generate the second data clock signal DCK2 by inverting the output signal of the fourth latch 814. The fourth inverter 824 may receive the output signal of the fifth latch 815. The fourth inverter 824 may generate the first data clock signal DCK1 by inverting the output signal of the fifth latch 815. The fifth inverter 825 may receive the output signal of the sixth latch 816. The first to fourth data clock signals DCK1 to DCK4 output from the first to fourth inverters 821 to 824 may the same frequency as the frequency of the output signal D of the phase controller 243 and have a lower frequency than the reference clock signal pair RCK and RCKB. The first data clock signal DCK1 may have a phase ahead of the second data clock signal DCK2 by 90°, and the second data clock signal DCK2 may have a phase ahead of the third data clock signal DCK3 by 90°. The third data clock signal DCK3 may have a phase ahead of the fourth data clock signal DCK4 by 90°, and the fourth data clock signal DCK4 may have a phase ahead of the first data clock signal DCK1 by 90°.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that all changes or modified forms derived from the meaning and scope of the claims and the equivalent concept thereof are included in the scope of the present disclosure.

What is claimed is:

1. A semiconductor apparatus comprising:
   a frequency control circuit configured to generate a frequency information signal based on a command address signal and configured to compare a first frequency setting signal with the frequency information to generate a first frequency control signal; and
   a clock receiver configured to receive a system clock signal to generate a received clock signal, to increase an alternating current (AC) gain of the clock receiver when the first frequency control signal is enabled, and to increase a direct current (DC) gain of the clock receiver when the first frequency control signal is disabled.

2. The semiconductor apparatus according to claim 1, wherein, when a frequency corresponding to the frequency information signal is higher than a frequency corresponding to the first frequency setting signal, the frequency control circuit is configured to enable the first frequency control signal.

3. The semiconductor apparatus according to claim 1, wherein the frequency control circuit comprises:
   a frequency detector configured to decode the command address signal to generate the frequency information signal; and
   a first frequency control signal generator configured to enable the first frequency control signal when a frequency corresponding to the frequency information signal is higher than a frequency corresponding to the first frequency setting signal, and to disable the first frequency control signal when the frequency corresponding to the frequency information signal is lower than the frequency corresponding to the first frequency setting signal.

4. The semiconductor apparatus according to claim 3, wherein the frequency control circuit further generates a second frequency control signal by comparing a second frequency setting signal with the frequency information signal, and further comprises:
   a second frequency control signal generator configured to enable the second frequency control signal when the frequency corresponding to the frequency information signal is higher than a frequency corresponding to the second frequency setting signal, and to disable the second frequency control signal when the frequency corresponding to the frequency information signal is lower than the frequency corresponding to the second frequency setting signal.

5. The semiconductor apparatus according to claim 1, wherein the clock receiver comprises:
   a first output node and a second output node receiving a first power supply voltage through a load circuit;
   a first input transistor configured to change a voltage level of the first output node based on the first output node and the system clock signal;
   a second input transistor configured to change a voltage level of the second output node based on a system clock bar signal;
   a first equalization transistor configured to connect the first output node and a first node according to the voltage level of the second output node;
   a second equalization transistor configured to connect the second output node and a second node according to the voltage level of the first output node;
   a capacitor connected between the first and second nodes;
   a switching transistor configured to connect the first and second nodes based on the first frequency control signal;
   a first current source connected between a node to which a second power supply voltage is supplied and the first node; and a second current source connected between the node to which the second power supply voltage is supplied and the second node, wherein the received clock signal is output from the second output node and a received clock bar signal is output from the first output node.

6. The semiconductor apparatus according to claim 5, wherein the switching transistor is configured to connect the first and second nodes when the first frequency control signal is disabled and to electrically isolate the first and second nodes when the first frequency control signal is enabled.

7. The semiconductor apparatus according to claim 5, wherein the load circuit is configured to decrease a resistance value of the load circuit when the first frequency control signal is enabled and to increase the resistance value of the load circuit when the first frequency control signal is disabled.

8. The semiconductor apparatus according to claim 5, wherein the load circuit comprises:

a first resistor connected between the node to which the first power supply voltage is supplied and the first output node;

a second resistor connected between the node to which the first power supply voltage is supplied and the second output node;

a first load transistor configured to connect the node to which the first power supply voltage is supplied and the first output node based on the first frequency control signal;

a second load transistor configured to connect the node to which the first power supply voltage is supplied and the second output node based on the first frequency control signal; and a third load transistor configured to connect the first output node and the second output node based on the first frequency control signal.

9. The semiconductor apparatus according to claim 5, wherein the frequency control circuit further generates a second frequency control signal by comparing a second frequency setting signal with the frequency information signal.

10. The semiconductor apparatus according to claim 9, wherein the clock receiver further comprises:

a third current source connected between the first input transistor and the node to which the second power supply voltage is supplied; and a fourth current source connected between the second input transistor and the node to which the second power supply voltage is supplied, wherein an amount of current of the third current source and an amount of current of the fourth current source are varied based on the second frequency control signal.

11. The semiconductor apparatus according to claim 9, wherein an amount of current of the first current source and an amount of current of the second current source are varied based on the second frequency control signal.

12. The semiconductor apparatus according to claim 5, wherein the clock receiver further comprises:

a feedback circuit configured to generate a first feedback signal and a second feedback signal by differentially amplifying the received clock signal and the received clock bar signal when the first frequency control signal is enabled;

a third input transistor configured to change the voltage level of the first output node based on the second feedback signal; and a fourth input transistor configured to change the voltage level of the second output node based on the first feedback signal.

13. The semiconductor apparatus according to claim 12, wherein the frequency control circuit further generates a second frequency control signal by comparing a second frequency setting signal with the frequency information signal, and the clock receiver further comprises:

a fifth current source connected between the third input transistor and the node to which the second power supply voltage is supplied; and a sixth current source connected between the fourth input transistor and the node to which the second power supply voltage is supplied, wherein an amount of current of the fifth current source and an amount of current of the sixth current source are varied based on the second frequency control signal.

14. The semiconductor apparatus according to claim 13, further comprising:

a first transistor connected between the fifth current source and the node to which the second power supply voltage is supplied, and configured to receive the first frequency control signal; and a second transistor connected between the sixth current source and the node to which the second power supply voltage is supplied, and configured to receive the first frequency control signal.

15. The semiconductor apparatus according to claim 12, wherein the feedback circuit comprises:

a first amplifier configured to generate an amplified signal pair by differentially amplifying the received clock signal and the received clock bar signal when the first frequency control signal is enabled; and a second amplifier configured to generate the first and second feedback signals by differentially amplifying the amplified signal pair when the first frequency control signal is enabled.

16. The semiconductor apparatus according to claim 5, further comprising:

a first inductor connected between the load circuit and the first output node; and a second inductor connected between the load circuit and the second output node.

17. A semiconductor apparatus comprising:

a frequency control circuit configured to generate a frequency information signal based on a command address signal, to compare a first frequency setting signal with the frequency information to generate a first frequency control signal, and to compare a second frequency setting signal with the frequency information to generate a second frequency control signal; and a clock receiver configured to receive a system clock signal to generate a received clock signal, to vary a gain of the clock receiver based on the first frequency clock signal, and to adjust a current driving ability for outputting the received clock signal based on the second frequency control signal.

* * * * *